US008271219B2

(12) United States Patent
Yamaguchi et al.

(10) Patent No.: US 8,271,219 B2
(45) Date of Patent: *Sep. 18, 2012

(54) DETERMINISTIC COMPONENT MODEL IDENTIFYING APPARATUS, IDENTIFYING METHOD, PROGRAM, RECORDING MEDIUM, TEST SYSTEM AND ELECTRONIC DEVICE

(75) Inventors: Takahiro Yamaguchi, Miyagi (JP);
Masahiro Ishida, Miyagi (JP);
Kiyotaka Ichiyama, Saitama (JP)

(73) Assignee: Advantest Corporation, Tokyo (JP)

( * ) Notice: Subject to any disclaimer, the term of this patent is extended or adjusted under 35 U.S.C. 154(b) by 987 days.

This patent is subject to a terminal disclaimer.

(21) Appl. No.: 12/257,395

(22) Filed: Oct. 24, 2008

(65) Prior Publication Data

US 2010/0106468 A1    Apr. 29, 2010

(51) Int. Cl.
*G01R 13/00* (2006.01)
*G01R 29/26* (2006.01)
*G06F 17/18* (2006.01)
*G06F 17/17* (2006.01)

(52) U.S. Cl. .................... 702/69; 702/180; 702/181

(58) Field of Classification Search .............. 703/2, 13; 702/69, 180–181
See application file for complete search history.

(56) References Cited

U.S. PATENT DOCUMENTS

| 7,062,393 | B2 * | 6/2006 | Laquai | 702/69 |
| 7,191,080 | B2 * | 3/2007 | Stephens | 702/69 |
| 7,516,030 | B2 * | 4/2009 | Miller | 702/69 |
| 8,000,931 | B2 * | 8/2011 | Ichiyama et al. | 702/181 |
| 2008/0077357 | A1 * | 3/2008 | Yamaguchi et al. | 702/181 |

FOREIGN PATENT DOCUMENTS

| WO | 2008018587 | 2/2008 |
| WO | 2008018588 | 2/2008 |

OTHER PUBLICATIONS

Miller, Martin. "Total jitter measurement through the extrapolation of jitter historgrams", Jan. 27, 2005, 8 pages.*
Schnecker, Michael. "Jitter Measurements in Serial Data Signals", 2006, 10 pages.*
"International Search Report of PCT Counterpart Application" issued on May 26, 2011, p. 1-6, in which the listed references were cited.
"Search Report of PCT counterpart application", issued on Jan. 26, 2010, p. 1-5.

* cited by examiner

*Primary Examiner* — Suzanne Lo
(74) *Attorney, Agent, or Firm* — Jianq Chyun IP Office

(57) ABSTRACT

There is provided a deterministic component model identifying apparatus for determining a type of a deterministic component contained in a probability density function supplied thereto. The deterministic component model identifying apparatus includes a spectrum calculating section that calculates a spectrum of the probability density function on an axis of a predetermined variable, a null value detecting section that detects a null value on the axis of the predetermined variable in the calculated spectrum, a theoretical value calculating section that calculates a theoretical value of a spectrum of the deterministic component in association with each of a plurality of predetermined deterministic component types, based on the null value detected by the null value detecting section, and a model determining section that determines, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the spectrum calculated by the spectrum calculating section.

8 Claims, 32 Drawing Sheets

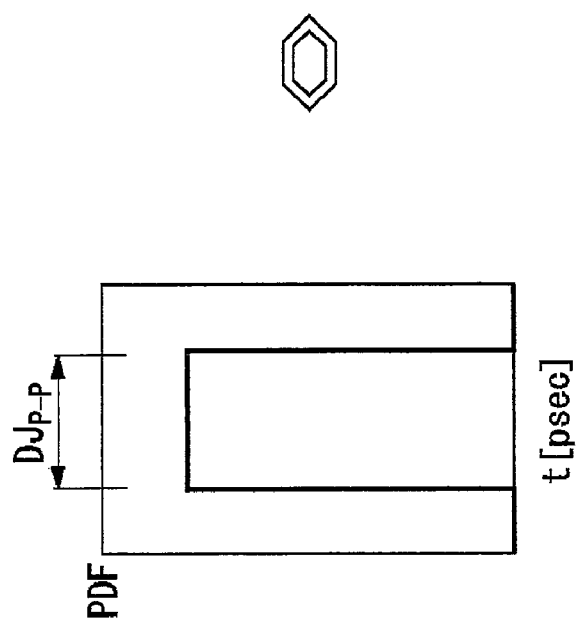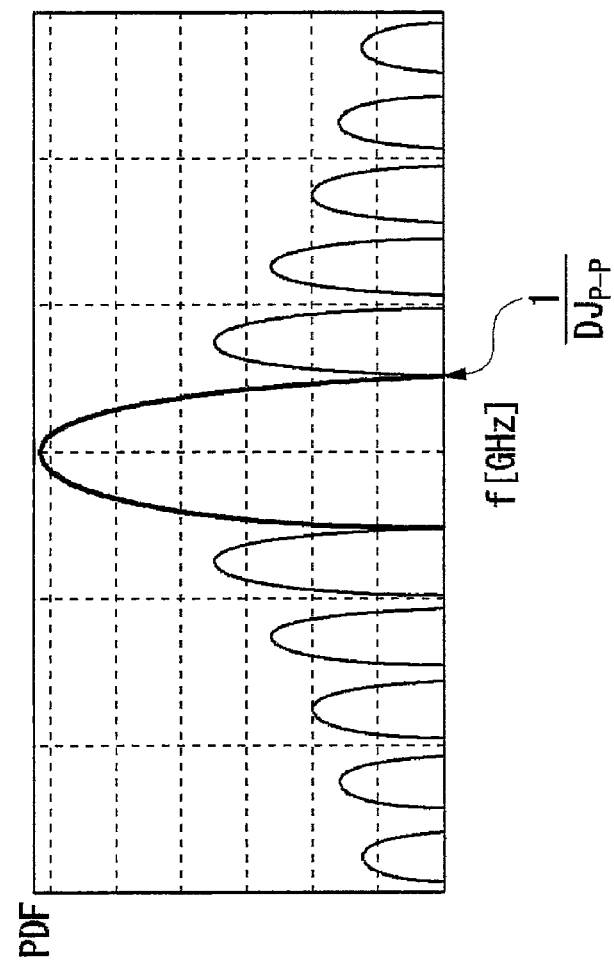
FIG. 5B

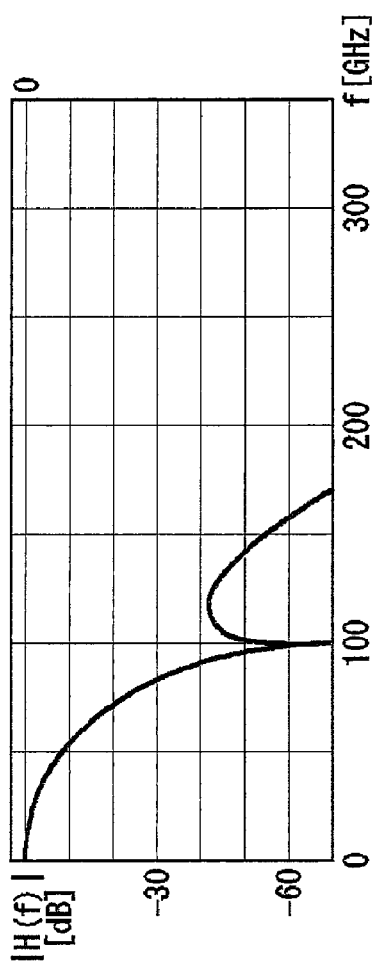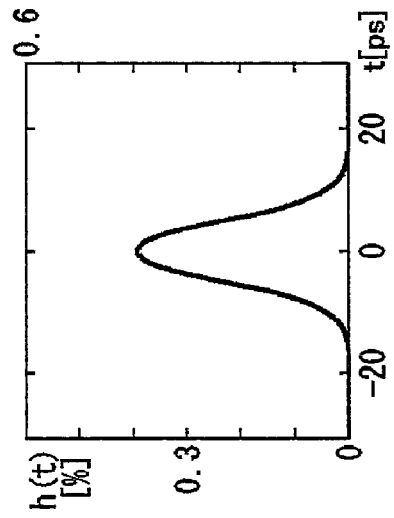
FIG. 6A

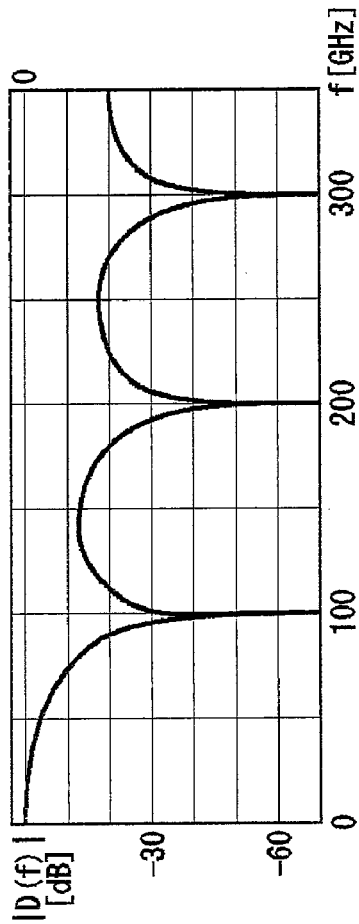
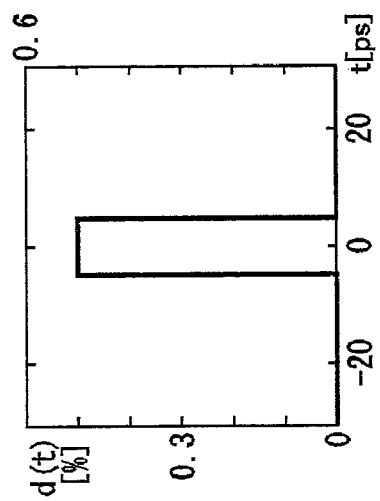
FIG. 6B

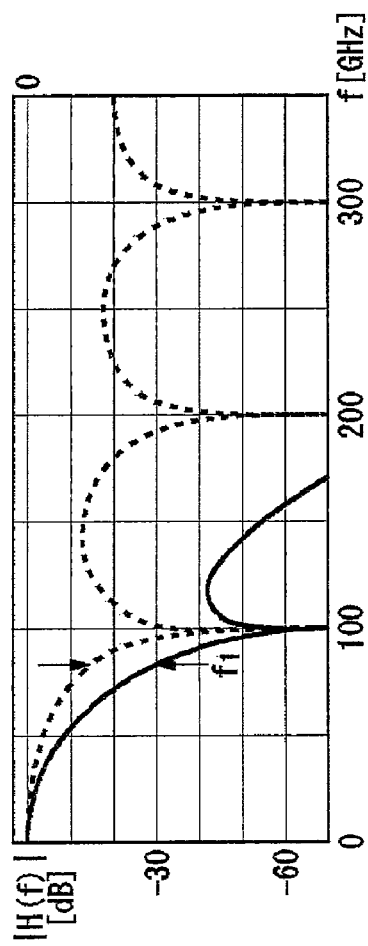
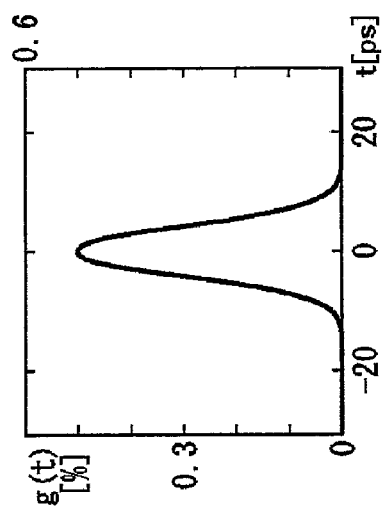
FIG. 6C

| DETERMINISTIC COMPONENT TYPE | PROBABILITY DENSITY FUNCTION OF DETERMINISTIC COMPONENT | | NULL FREQUENCY $f_{zero}$ |
|---|---|---|---|
| | TIME DOMAIN $d(t)$ | FREQUENCY DOMAIN $D(f)$ | |
| SINUSOIDAL DISTRIBUTION | $\dfrac{2}{\pi\sqrt{DJ_{p-p}^2 - 4t^2}}$ | $I_0(\pi \cdot DJ_{p-p} \cdot f)$ | $\dfrac{0.765}{DJ_{p-p}}$ |
| TRAPEZOID DISTRIBUTION | $\dfrac{-\alpha \cdot DJ_{p-p}/2 < \|t\| < DJ_{p-p}/2}{\dfrac{2DJ_{p-p}^2 - 4\|t\|}{DJ_{p-p}^2(1-\alpha^2)}}$ $\dfrac{-\alpha \cdot DJ_{p-p}/2 > \|t\|}{\dfrac{2}{DJ_{p-p}(1+\alpha)}}$ | $\mathrm{sinc}\left[\dfrac{(1+\alpha)}{2} \cdot DJ_{p-p} \cdot f\right] \cdot \mathrm{sinc}\left[\dfrac{(1-\alpha)}{2} \cdot DJ_{p-p} \cdot f\right]$ | $\dfrac{2}{(1+\alpha) \cdot DJ_{p-p}}$ |
| DUAL-DIRAC DISTRIBUTION | $\dfrac{\delta\left(t + \dfrac{DJ_{p-p}}{2}\right) + \delta\left(t - \dfrac{DJ_{p-p}}{2}\right)}{2}$ | $\cos(\pi \cdot DJ_{p-p} \cdot f)$ | $\dfrac{1}{2 \cdot DJ_{p-p}}$ |
| DIRAC DISTRIBUTION | $\delta(t)$ | Constant, 1 | No null frequency |

*FIG. 7*

DETERMINISTIC COMPONENT MODEL IDENTIFYING APPARATUS, IDENTIFYING METHOD, PROGRAM, RECORDING MEDIUM, TEST SYSTEM AND ELECTRONIC DEVICE

BACKGROUND

1. Technical Field

The present invention relates to a deterministic component model identifying apparatus, an identifying method, a program, a recording medium, a test system, and an electronic device.

2. Related Art

Conventionally, electronic circuits, communication systems and the like may be evaluated based on measurement of characteristic values of electrical signals and the like. In the field of serial communication, for example, communication systems may be evaluated by measuring jitter contained in transmission or reception signals.

A characteristic value such as jitter is divided into deterministic and random components. The deterministic components are deterministically generated according to signal patterns and characteristics of transmission paths and the like, and the random components are randomly generated. To achieve relatively detailed evaluation, the deterministic and random components are preferably separated from each other.

Deterministic and random components may be separately measured by measuring a characteristic value multiple times and thus creating a histogram (also referred to as a probability density function). Conventionally, random components are separated from the resultant histogram in such a manner that the left and right tails of the histogram are approximated by a random distribution (a Gaussian distribution). Furthermore, the deterministic components are separated from the resultant histogram in such a manner that an interval between mean values of the two random components generated by the approximation is calculated as a peak-to-peak value of the deterministic components.

Here, the conventional separating method assumes that deterministic components contained in a histogram have a dual-Dirac model. It should be noted, however, that there are other deterministic component models such as a sinusoidal distribution and a uniform distribution. Therefore, the conventional separating method has difficulties in accurately separating jitter into deterministic and random components when a histogram contains other deterministic component models than the dual-Dirac model. For example, as shown in FIG. 2, when a histogram contains deterministic components having a sinusoidal distribution, the conventional separating method yields a peak-to-peak value $DJ(\delta\text{-}\delta)$ for the deterministic components, which is smaller than a true value $DJ_{P\text{-}P}$.

SUMMARY

Therefore, it is an object of an aspect of the innovations herein to provide a deterministic component model identifying apparatus, an identifying method, a program, a recording medium, a test system and an electronic device which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary deterministic component model identifying apparatus for determining a type of a deterministic component contained in a probability density function supplied thereto may include a spectrum calculating section that calculates a spectrum of the probability density function on an axis of a predetermined variable, a null value detecting section that detects a null value on the axis of the predetermined variable in the calculated spectrum, a theoretical value calculating section that calculates a theoretical value of a spectrum of the deterministic component in association with each of a plurality of predetermined deterministic component types, based on the null value detected by the null value detecting section, and a model determining section that determines, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the spectrum calculated by the spectrum calculating section.

According to the second aspect related to the innovations herein, one exemplary deterministic component model identifying method for determining a type of a deterministic component contained in a supplied probability density function may include calculating a spectrum of the probability density function on an axis of a predetermined variable, detecting a null value on the axis of the predetermined variable in the calculated spectrum, calculating a theoretical value of a spectrum of the deterministic component in association with each of a plurality of predetermined deterministic component types, based on the detected null value, and determining, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the calculated spectrum.

According to the third aspect related to the innovations herein, one exemplary program for causing a computer to function as a deterministic component model identifying apparatus for determining a type of a deterministic component contained in a probability density function supplied thereto may cause the computer to function as a spectrum calculating section that calculates a spectrum of the probability density function on an axis of a predetermined variable, a null value detecting section that detects a null value on the axis of the predetermined variable in the calculated spectrum, a theoretical value calculating section that calculates a theoretical value of a spectrum of the deterministic component in association with each of a plurality of predetermined deterministic component types, based on the null value detected by the null value detecting section, and a model determining section that determines, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the spectrum calculated by the spectrum calculating section.

According to the fourth aspect related to the innovations herein, one exemplary test system for testing a device under test may include a measuring section that measures a predetermined characteristic of the device under test multiple times, a deterministic component model identifying apparatus that determines a type of a deterministic component contained in a probability density function of the characteristic measured by the measuring section and calculates the deterministic component, and an acceptability judging section that judges whether the device under test is acceptable, based on the deterministic component calculated by the deterministic component model identifying apparatus. Here, the deterministic component model identifying apparatus includes a spectrum calculating section that calculates a spectrum of the probability density function on an axis of a predetermined variable, a null value detecting section that detects a null value on the axis of the predetermined variable in the calculated spectrum, a theoretical value calculating section that calculates a theoretical value of a spectrum of the deterministic component in association with each of a plurality of predetermined deterministic component types, based on the null value detected by the null value detecting section, and a model determining section that determines, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the spectrum calculated by the spectrum calculating section.

According to the fifth aspect related to the innovations herein, one exemplary electronic device for generating a predetermined signal may include an operational circuit that generates the predetermined signal and outputs the predetermined signal, a measuring section that measures a predetermined characteristic of the predetermined signal multiple times, and a deterministic component model identifying apparatus that determines a type of a deterministic component contained in a probability density function of the characteristic measured by the measuring section and calculates the deterministic component. Here, the deterministic component model identifying apparatus includes a spectrum calculating section that calculates a spectrum of the probability density function on an axis of a predetermined variable, a null value detecting section that detects a null value on the axis of the predetermined variable in the calculated spectrum, a theoretical value calculating section that calculates a theoretical value of a spectrum of the deterministic component in association with each of a plurality of predetermined deterministic component types, based on the null value detected by the null value detecting section, and a model determining section that determines, as the type of the deterministic component contained in the probability density function, a deterministic component type associated with a logarithmic magnitude spectrum difference most similar to a logarithmic magnitude spectrum of a Gaussian distribution, where the logarithmic magnitude spectrum difference is produced by subtracting the theoretical value of the spectrum of the deterministic component calculated in association with each of the plurality of predetermined deterministic component types from the spectrum calculated by the spectrum calculating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 5B is used to explain a deterministic component having a uniform distribution.

FIG. 6A shows, as an example, a probability density function h(t) supplied to the deterministic component model identifying apparatus 100 and a spectrum H(f) of the probability density function h(t).

FIG. 6B shows, as an example, a deterministic component d(t) having a uniform distribution and a spectrum D(f) of the distribution.

FIG. 6C shows a random component g(t) contained in the probability density function h(t) and a comparison between the spectrum H(f) of the probability density function and the spectrum D(f) of the deterministic component.

FIG. 7 is a table showing, in association with each deterministic component type, a model formula in the time domain, a model formula in the frequency domain, and a relation between a first null frequency $f_{zero}$ and a peak-to-peak value $DJ_{P-P}$.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
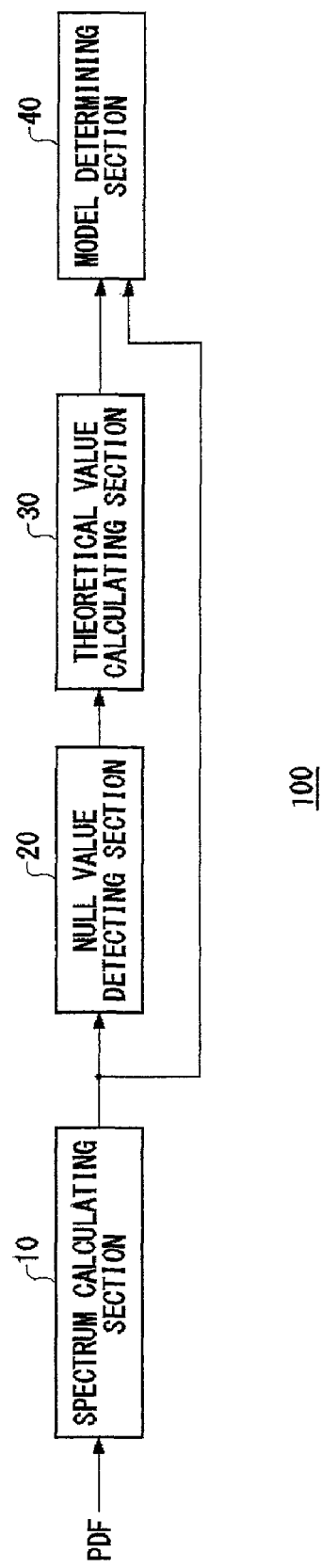
FIG. 1 illustrates an exemplary functional configuration of a deterministic component model identifying apparatus 100 relating to an embodiment of the present invention.

FIG. 1 illustrates an exemplary functional configuration of a deterministic component model identifying apparatus 100 relating to an embodiment of the present invention. The deterministic component model identifying apparatus 100 relating to the present example determines the type of the deterministic component contained in a supplied probability density function PDF. The deterministic component model identifying apparatus 100 relating to the present example includes a spectrum calculating section 10, a null value detecting section 20, a theoretical value calculating section 30, and a model determining section 40.

The spectrum calculating section 10 calculates the spectrum of the supplied probability density function PDF on an axis of a predetermined variable. For example, the spectrum calculating section 10 may receive a probability density function PDF on the time axis and calculate a spectrum on the frequency axis. The spectrum calculating section 10 may calculate a spectrum by performing Fourier transform on a real-number probability density function PDF. Alternatively, the spectrum calculating section 10 may calculate a spectrum by performing inverse Fourier transform on a real-number probability density function PDF. The following describes the functions of the deterministic component model identifying apparatus 100 in an exemplary case where the spectrum calculating section 10 calculates a spectrum on the frequency axis.

The null value detecting section 20 detects a null value on the predetermined variable axis for the spectrum calculated by the spectrum calculating section 10. According to the present example, the null value detecting section 20 detects a null frequency of the spectrum. Here, the null frequency of the spectrum represents a frequency at which the power of the spectrum is substantially zero (or a frequency at which the spectrum indicates a minimal value).

The theoretical value calculating section 30 uses the null value detected by the null value detecting section 20 to calculate a theoretical value of a spectrum of the deterministic component in association with each of a predetermined number of deterministic component types. According to the present example, the theoretical value calculating section 30 uses a first null frequency detected by the null value detecting section 20 to calculate each theoretical value. Here, multiple deterministic component types may correspond to, for example, a sinusoidal distribution, a uniform distribution, a trapezoid distribution, and a dual-Dirac distribution. As will be explained later, a theoretical value of a deterministic component can be defined by a deterministic component type and a peak-to-peak value $DJ_{P\text{-}P}$.

The model determining section 40 determines the type of the deterministic component contained in the probability density function PDF, based on the spectrum calculated by the spectrum calculating section 10 and the theoretical value of the spectrum, calculated by the theoretical value calculating section 30, for each deterministic component type. The model determining section 40 may determine that the type of the deterministic component contained in the probability density function PDF is a deterministic component type associated with a logarithmic magnitude spectrum difference that is the most similar to a logarithmic magnitude spectrum of a Gaussian distribution, where the logarithmic magnitude spectrum difference is obtained by subtracting the theoretical value of the spectrum for each deterministic component type from the spectrum calculated by the spectrum calculating section 10.

When the spectrum calculated by the spectrum calculating section 10 and the spectrum of the deterministic component of each type are logarithmic magnitude spectra, the difference between these logarithmic magnitude spectra is defined as the above-mentioned logarithmic magnitude spectrum difference. Alternatively, when the spectrum calculated by the spectrum calculating section 10 and the spectrum of the deterministic component of each type are magnitude spectra, the ratio between these magnitude spectra may be defined as the above-mentioned logarithmic magnitude spectrum difference.

Since the probability density function PDF is given as a result of convolution of deterministic and random components, the logarithmic magnitude spectrum difference obtained by subtracting the spectrum of the deterministic component from the spectrum of the probability density function PDF is equivalent to the spectrum of the random component. When the subtracted spectrum of the deterministic component contains an error, however, the resultant logarithmic magnitude spectrum difference is a sum of the error in the deterministic component spectrum and the random component spectrum.

The error in the deterministic component spectrum is particularly significant when a wrong deterministic component model is selected. Therefore, it is possible to estimate the type of the deterministic component contained in the probability density function PDF by selecting a deterministic component type associated with a logarithmic magnitude spectrum difference that is the most similar to the spectrum of the random component.

Figure 2:
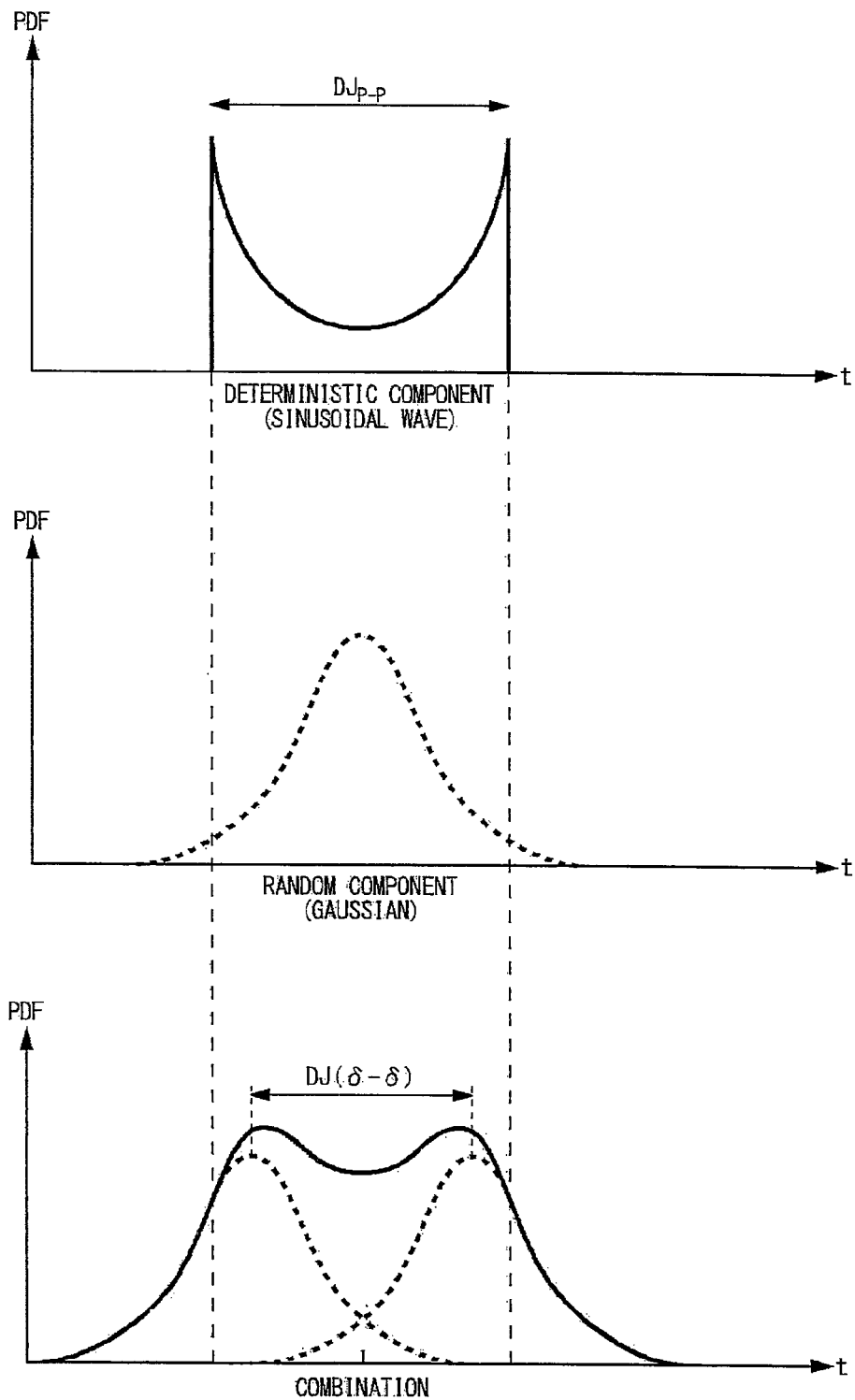
FIG. 2 illustrates an example of a probability density function supplied to the deterministic component model identifying apparatus 100.

FIG. 2 illustrates an example of the probability density function supplied to the deterministic component model identifying apparatus 100. The probability density function may be a function representing a distribution of measured values, which is obtained by measuring a predetermined characteristic of an electrical circuit or the like multiple times. The predetermined characteristic may be a jitter amount, an amplitude value, a DC value or the like of the signal output from an electrical circuit, an optical circuit or the like.

For example, the jitter amount may indicate phase noise of the signal. More specifically, the jitter amount may denote the difference between signal edge timings and ideal edge timings. In this case, the probability density function may represent a distribution of measured value (occurrence probability) obtained by measuring the jitter amount of each signal edge. The amplitude value may denote the amplitude of the voltage, current, light intensity or the like of the signal. The DC value may denote the DC level of the voltage, current, light intensity or the like of the signal.

Generally speaking, a probability density function of any of the above-mentioned characteristics contains deterministic and random components. For example, a probability density function of jitter amounts contains a deterministic jitter component that is deterministically generated by signal patterns, characteristics of transmission paths or the like and a random jitter component that is randomly generated by thermal noise or the like.

Here, the random component contained in the probability density function is given by a Gaussian distribution as shown in FIG. 2. It should be noted that the spectrum of the random component is also represented by a Gaussian distribution. On the other hand, the deterministic component is given by any one of a plurality of different models depending on its causes or the like. In FIG. 2, for example, the model of the deterministic component is a sinusoidal distribution. Alternatively, however, the model of the deterministic component may be a uniform distribution, a trapezoid distribution, a dual-Dirac distribution, a single-Dirac distribution or the like.

Figure 3A:
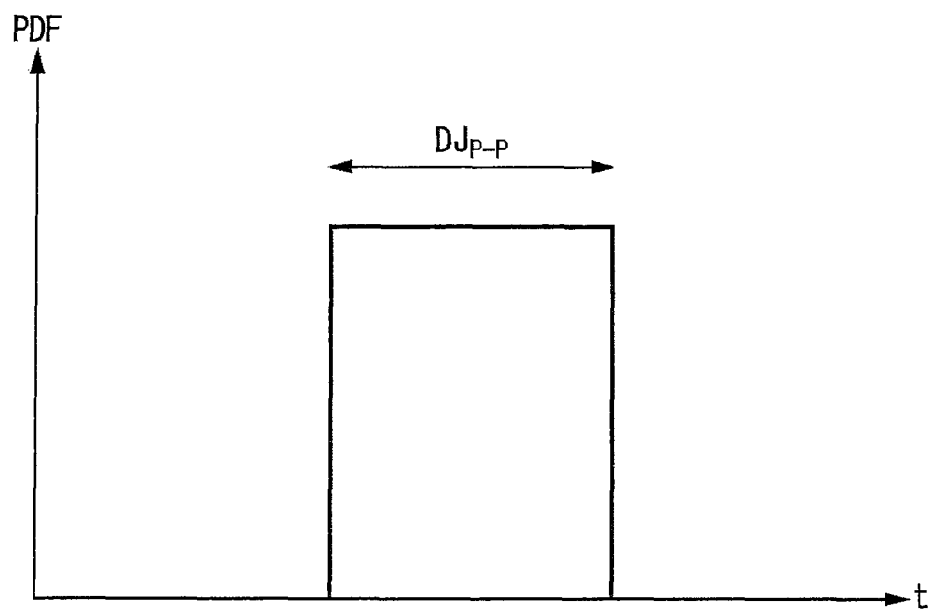
FIG. 3A shows a deterministic component having a uniform distribution.
Figure 3B:
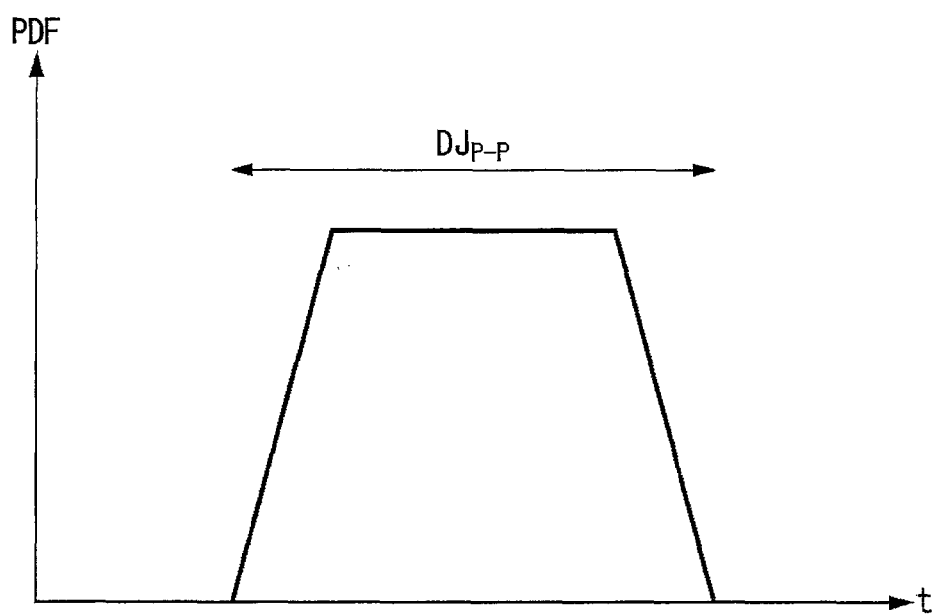
FIG. 3B shows a deterministic component having a trapezoid distribution.
Figure 4A:
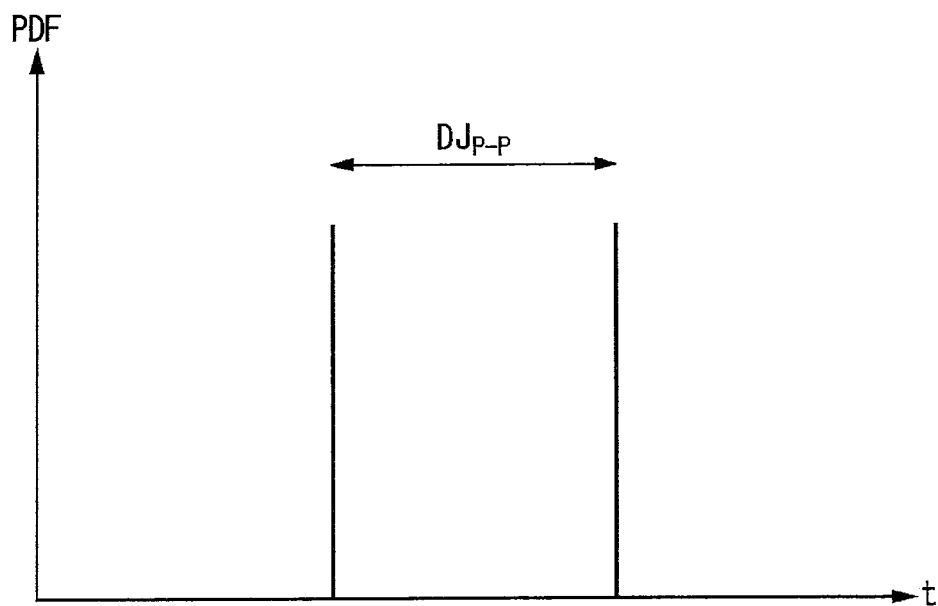
FIG. 4A shows a deterministic component having a dual-Dirac distribution.
Figure 4B:
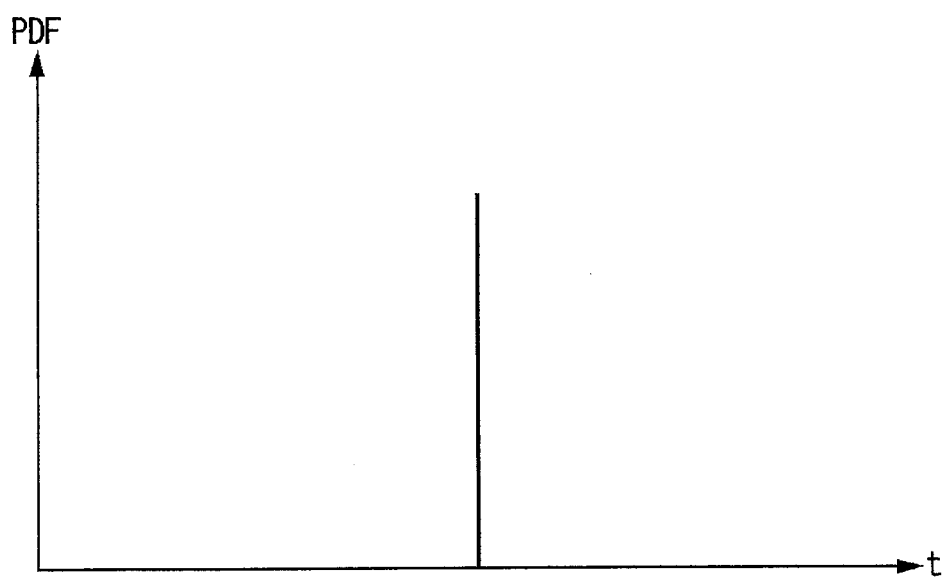
FIG. 4B shows a deterministic component having a single-Dirac distribution.

FIGS. 3A, 3B, 4A and 4B show probability density functions representing deterministic components in multiple different models. FIG. 3A shows a deterministic component having a uniform distribution. FIG. 3B shows a deterministic component having a trapezoid distribution. FIG. 4A shows a deterministic component having a dual-Dirac distribution. FIG. 4B shows a deterministic component having a single-Dirac distribution.

As seen from FIGS. 2 to 4B, a distribution of a deterministic component can be uniquely defined if its peak-to-peak value $DJ_{P\text{-}P}$ is determined regardless of which model the deterministic component has. To uniquely define a trapezoid distribution of a deterministic component, however, it is preferable to further know the ratio between the upper and lower sides. A deterministic component having a single-Dirac distribution is represented as having a peak-to-peak value of substantially zero. The deterministic component model identifying apparatus 100 relating to the present example calculates a peak-to-peak value $DJ_{P\text{-}P}$ of a deterministic component based on a first null frequency in a spectrum of a probability density function.

Figure 5A:
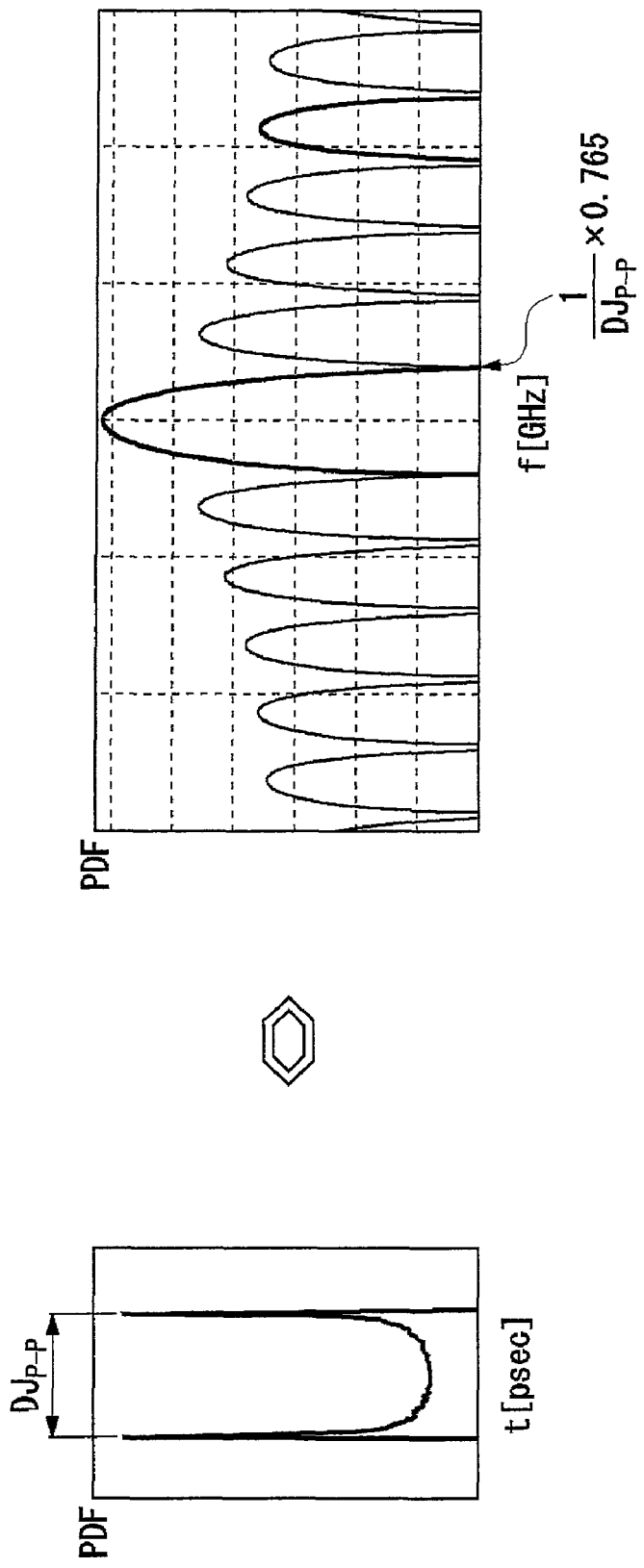
FIG. 5A is used to explain a deterministic component having a sinusoidal distribution.

FIGS. 5A and 5B each show a probability density function of a deterministic component of a predetermined model and a spectrum of the probability density function. FIG. 5A is used to explain a deterministic component having a sinusoidal distribution. FIG. 5B is used to explain a deterministic component having a uniform distribution. In FIGS. 5A and 5B, the left waveform shows a probability density function in the time domain, the right waveform shows a spectrum of the probability density function, and $DJ_{P\text{-}P}$ denotes the peak-to-peak value of the deterministic component in the time domain.

As seen from FIG. 5A, the first null frequency of the spectrum obtained by performing Fourier transform on the probability density function of a deterministic component having a sinusoidal distribution is given by $0.765/DJ_{P\text{-}P}$. Therefore, the peak-to-peak value $DJ_{P\text{-}P}$ of the deterministic component can be calculated by multiplying the inverse of the first null frequency by the coefficient of 0.765.

As seen from FIG. 5B, the first null frequency of the spectrum obtained by performing Fourier transform on the probability density function of a deterministic component having a uniform distribution is given by $1/DJ_{P\text{-}P}$. Therefore, the peak-to-peak value $DJ_{P\text{-}P}$ of the deterministic component can be calculated by obtaining the inverse of the first null frequency.

When the deterministic component has a different type of distribution such as a trapezoid distribution or dual-Dirac distribution, the peak-to-peak value can be similarly calculated based on the first null frequency. It should be noted that, however, the relation between the first null frequency and the peak-to-peak value $DJ_{P\text{-}P}$ varies depending on the model of the deterministic component as seen from FIGS. 5A and 5B. Therefore, it is essential to determine the model of the deterministic component in order to accurately calculate the deterministic component.

FIG. 6A shows, as an example, a probability density function h(t) supplied to the deterministic component model identifying apparatus 100 and a spectrum H(f) of the probability density function h(t). FIG. 6B shows, as an example, a deterministic component d(t) having a uniform distribution and a spectrum D(f) of the distribution. FIG. 6C shows a random component g(t) contained in the probability density function h(t) and a comparison between the spectrum H(f) of the probability density function and the spectrum D(f) of the deterministic component.

The spectrum calculating section 10 receives the probability density function h(t) shown in FIG. 6A, and calculates the power spectrum |H(f)| of the received probability density function. The null value detecting section 20 detects a first null frequency of the spectrum |H(f)| shown in FIG. 6A. According to the present example, the spectrum calculating section 10 detects, as the first null frequency, 100 GHz at which the spectrum |H(f)| becomes substantially zero.

The theoretical value calculating section 30 calculates a theoretical value of a spectrum of a deterministic component of each predetermined type, by using the first null frequency of the spectrum |H(f)|. For example, the spectrum shown in FIG. 6B is calculated in association with a deterministic component having a uniform distribution. It should be noted that the first null frequency of the probability density function h(t) is substantially the same as the first null frequency of the spectrum of the deterministic component contained in the probability density function h(t). How to calculate the theoretical value of the spectrum of the deterministic component by referring to the first null frequency will be described later with reference to FIG. 7.

The model determining section 40 determines the type of the deterministic component based on the spectrum |H(f)| and the spectrum |D(f)|. The model determining section 40 may calculate a logarithmic magnitude spectrum difference which is a difference between the spectrum |H(f)| and the spectrum |D(f)|. As mentioned above, the logarithmic magnitude spectrum difference is equivalent to the logarithmic magnitude spectrum of the random component (a Gaussian distribution). For this reason, the model determining section 40 can determine the type of the deterministic component d(t) contained in the probability density function h(t) by selecting a deterministic component type that produces a logarithmic magnitude spectrum difference that is the most similar to a logarithmic magnitude spectrum of a Gaussian distribution.

FIG. 7 is a table showing, in association with each deterministic component type, a model formula in the time domain, a model formula in the frequency domain, and a relation between a first null frequency $f_{zero}$ and a peak-to-peak value $DJ_{P-P}$. In FIG. 7, $I_0$ denotes a zero-th order Bessel function of the first kind.

In FIG. 7, α denotes the ratio of the upper side to the lower side in relation to a trapezoid distribution. In other words, a trapezoid distribution is equivalent to a uniform distribution when α=1 and equivalent to a triangular distribution when α=0. It should be noted that the deterministic component model identifying apparatus 100 can deal with any other deterministic component types than the above-mentioned types. The deterministic component model identifying apparatus 100 may be configured for all of the deterministic component models for which the peak-to-peak value can be calculated from the first null frequency of the spectrum.

As presented in FIG. 7, the theoretical value of the spectrum of the deterministic component can be defined by the type of the deterministic component and the first null frequency. The theoretical value calculating section 30 may be provided with a table, such as shown in FIG. 7, indicating a model formula in the frequency domain and a relation between the first null frequency $f_{zero}$ and the peak-to-peak value $DJ_{P-P}$ in association with each deterministic component type. The theoretical value calculating section 30 may calculate a theoretical value for each deterministic component type with reference to this table.

Figure 8:
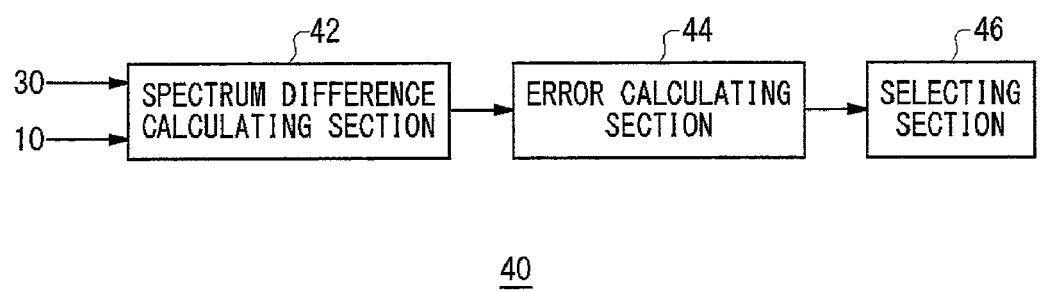
FIG. 8 illustrates an exemplary configuration of a model determining section 40.

FIG. 8 illustrates an exemplary configuration of the model determining section 40. According to the present example, the model determining section 40 includes a spectrum difference calculating section 42, an error calculating section 44, and a selecting section 46. The spectrum difference calculating section 42 calculates, in association with each deterministic component type, a logarithmic magnitude spectrum difference by subtracting the theoretical value of the spectrum D(f) of the deterministic component from the spectrum H(f) calculated by the spectrum calculating section 10.

The spectrum H(f) of the probability density function PDF is represented by the following equation by using the spectrum G(f) of the random component and the spectrum D(f) of the deterministic component.

$$H(f) = D(f) \cdot R(f) \quad \text{Equation 1}$$

Here, the random component exhibits a Gaussian distribution, and Equation 1 can be thus changed into the following equation.

$$H(f) = D(f) \cdot e^{-f^2/2\sigma_f^2} \quad \text{Equation 2}$$

By calculating a logarithm with a base of "e" for each side of Equation 2, the following equation is obtained.

$$\log_e H(f) = \log_e D(f) - \frac{1}{2\sigma_f^2} f^2 \quad \text{Equation 3}$$

The spectrum difference calculating section 42 may first transform the spectrum H(f) and the theoretical value D(f) of the spectrum of a deterministic component of each type into a logarithm with a base of e, and then calculate a difference between the resultant logarithms. In other words, the spectrum difference calculating section 42 may calculate, in association with each deterministic component type, a logarithmic magnitude spectrum difference represented as follows.

$$\log_e H(f) - \log_e D(f) \quad \text{Equation 4}$$

The error calculating section 44 calculates, in association with each deterministic component type, a residual error by subtracting a component corresponding to a logarithmic magnitude spectrum of a Gaussian distribution from the logarithmic magnitude spectrum difference. Specifically, the error calculating section 44 may calculate a residual error represented by the following equation.

$$\log_e |H(f)| - \log_e |D(f)| - \frac{-1}{2\hat{\sigma}_f^2} f^2 = \text{error} \quad \text{Equation 5}$$

Referring to Equation 5, the standard deviation σ may take a different value depending on each deterministic component type. The error calculating section 44 may set a standard deviation σ in association with each deterministic component type such that the residual error for each deterministic component type takes a smallest value.

As seen from Equation 5, since the spectra are first transformed into logarithms and then the difference between the resultant logarithms is calculated, the component corresponding to the logarithmic magnitude spectrum of a Gaussian distribution is represented by a quadratic curve. That is to say, the error calculating section 44 may calculate the component corresponding to the logarithmic magnitude spectrum of a Gaussian distribution by approximating the logarithmic magnitude spectrum difference by a quadratic curve. The approximation by using a quadratic curve may be performed by using any of known methods such as a least square method. The error calculating section 44 may then calculate, in association with each deterministic component type, a residual error by removing the quadratic curve component from the logarithmic magnitude spectrum difference represented by a logarithm.

The residual error given by Equation 5 does not contain the component represented by a Gaussian distribution, and thus indicates an error attributable to the deterministic component D(f). The residual error represented by Equation 5 is particularly significant when the deterministic component model used to calculate the residual error does not match the type of the deterministic component contained in the probability density function h(t).

The selecting section 46 selects, from among the residual errors calculated by the error calculating section 44 for respective deterministic component types, the smallest residual error and assigns a deterministic component type that yields the selected smallest residual error as the type of the deterministic component contained in the probability density function h(t). In the above-described manner, the deterministic component model identifying apparatus 100 can determine the type of the deterministic component contained in the probability density function h(t).

Figure 9:
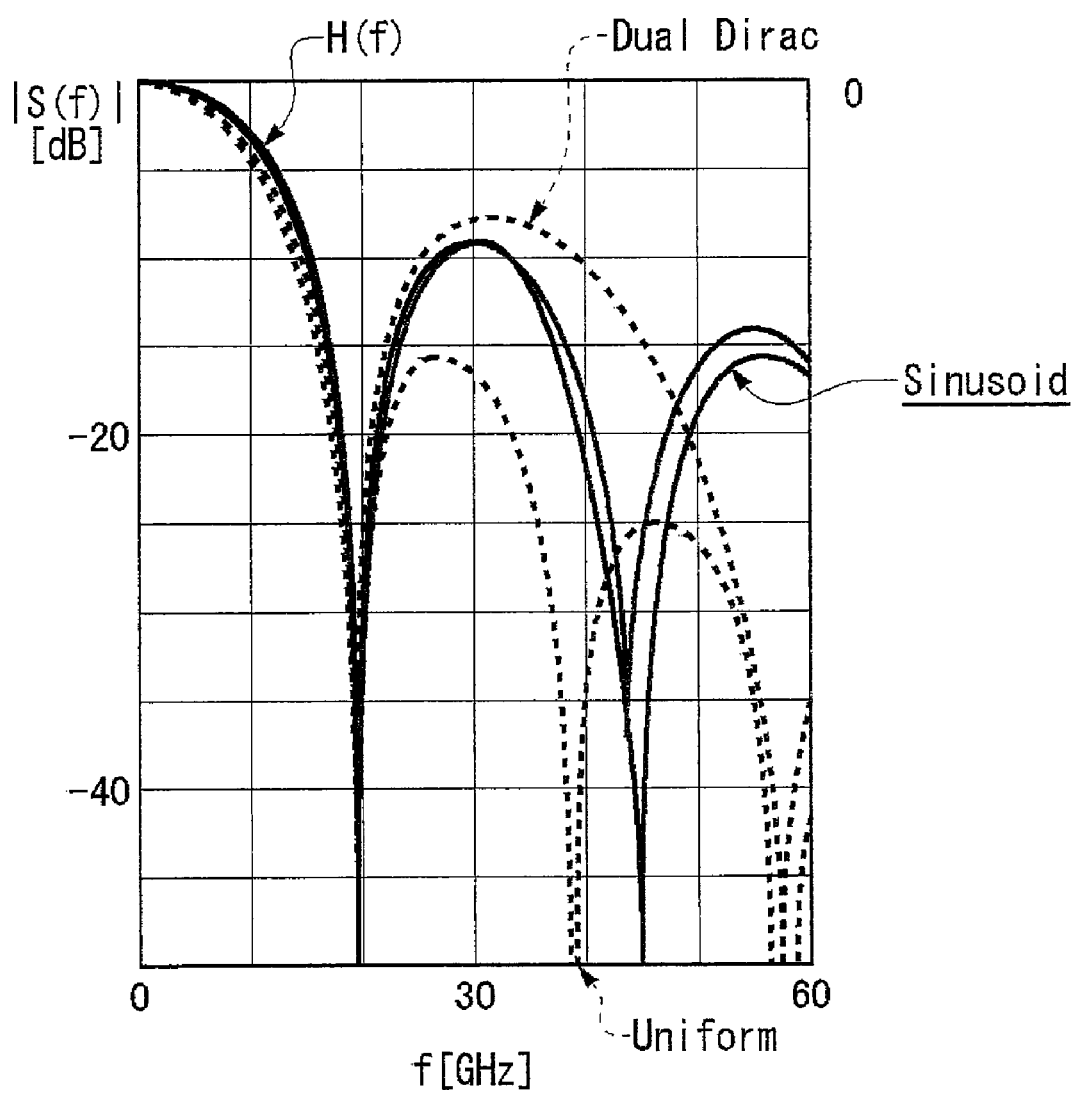
FIG. 9 illustrates, as an example, the spectrum H(f) of the probability density function PDF and a theoretical value of a spectrum of a deterministic component of each type.

FIG. 9 illustrates, as an example, the spectrum H(f) of the probability density function PDF and a theoretical value of a spectrum of a deterministic component of each type. The deterministic component types shown in FIG. 9 include a sinusoidal distribution, a uniform distribution, and a dual-Dirac distribution. It should be noted that, in the present example, the probability density function PDF contains a deterministic component having a sinusoidal distribution. As shown in FIG. 9, the first and second null frequencies of a theoretical spectrum obtained assuming that the contained deterministic component has a sinusoidal distribution are substantially the same as the null frequencies of the probability density function PDF containing a sinusoidal distribution.

Figure 10:
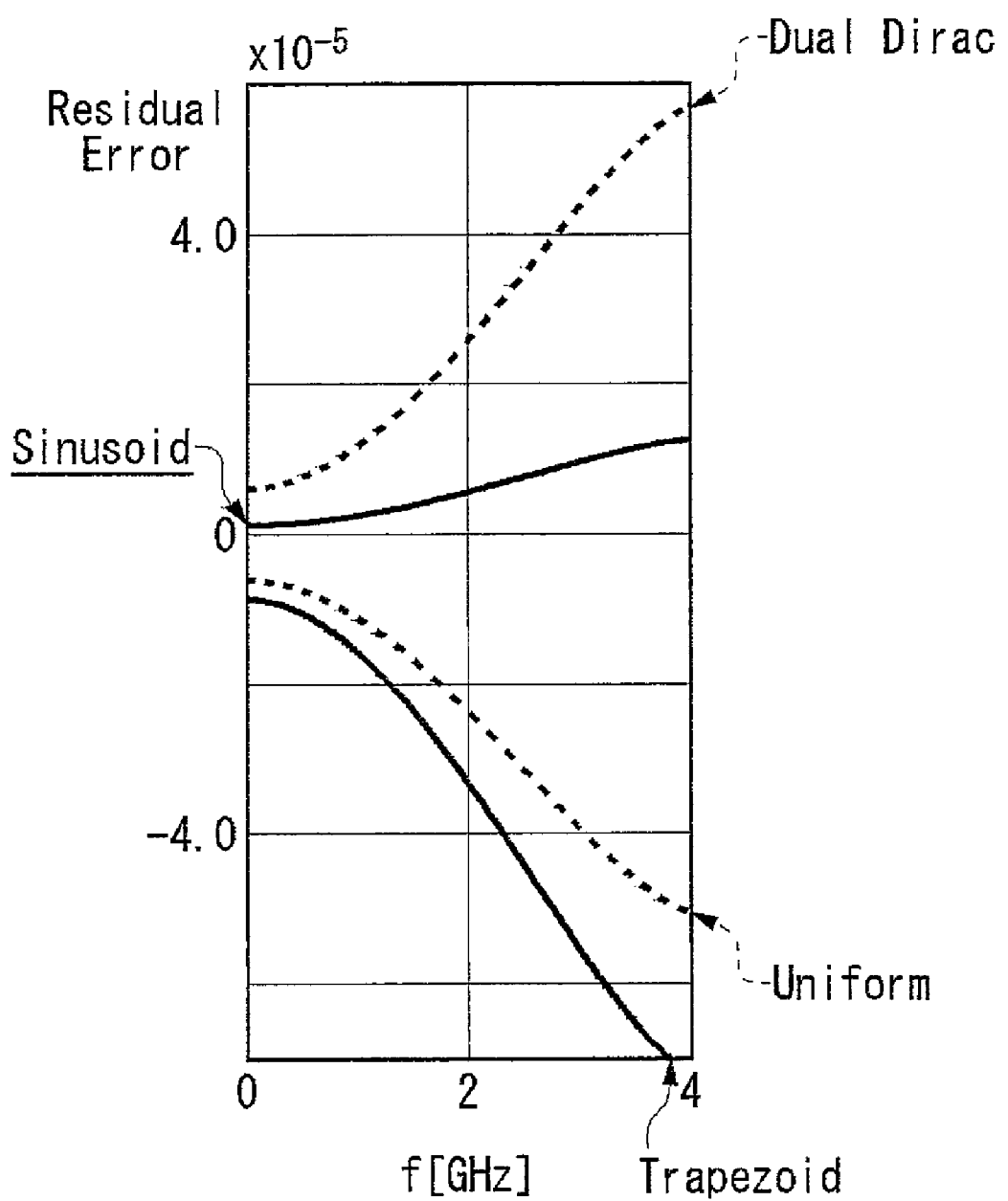
FIG. 10 illustrates an exemplary residual error calculated in association with each deterministic component type in the exemplary case shown in FIG. 9.

FIG. 10 illustrates an exemplary residual error calculated in association with each deterministic component type in the exemplary case shown in FIG. 9. As seen from FIG. 10, a smaller residual error is yielded for a particular deterministic component type that is the same as the type of the deterministic component contained in the probability density function (in the present example, the deterministic component having a sinusoidal distribution) than for other deterministic component types.

The selecting section 46 may make the deterministic component type selection by referring to the values of the residual errors at a predetermined frequency. Here, note that quadratic curves corresponding to a Gaussian distribution exhibit a substantially constant change at a sufficiently low frequency. Hence, the selecting section 46 may compare the residual error values associated with the respective deterministic component types at a sufficiently low frequency.

For example, the selecting section 46 may detect a value at a component closest to the DC component (i.e. f=0) in the residual error obtained for each deterministic component type, and select a deterministic component type associated with the smallest value from among the thus detected values, as the type of the deterministic component contained in the probability density function. Here, the component closest to the DC component may indicate a component in the first frequency bin in the residual error spectra shown in FIG. 10. Furthermore, the smallest value means a value having the smallest absolute value. In the above-described manner, the deterministic component model identifying apparatus 100 can estimate the type of the deterministic component contained in the probability density function.

Figure 11:
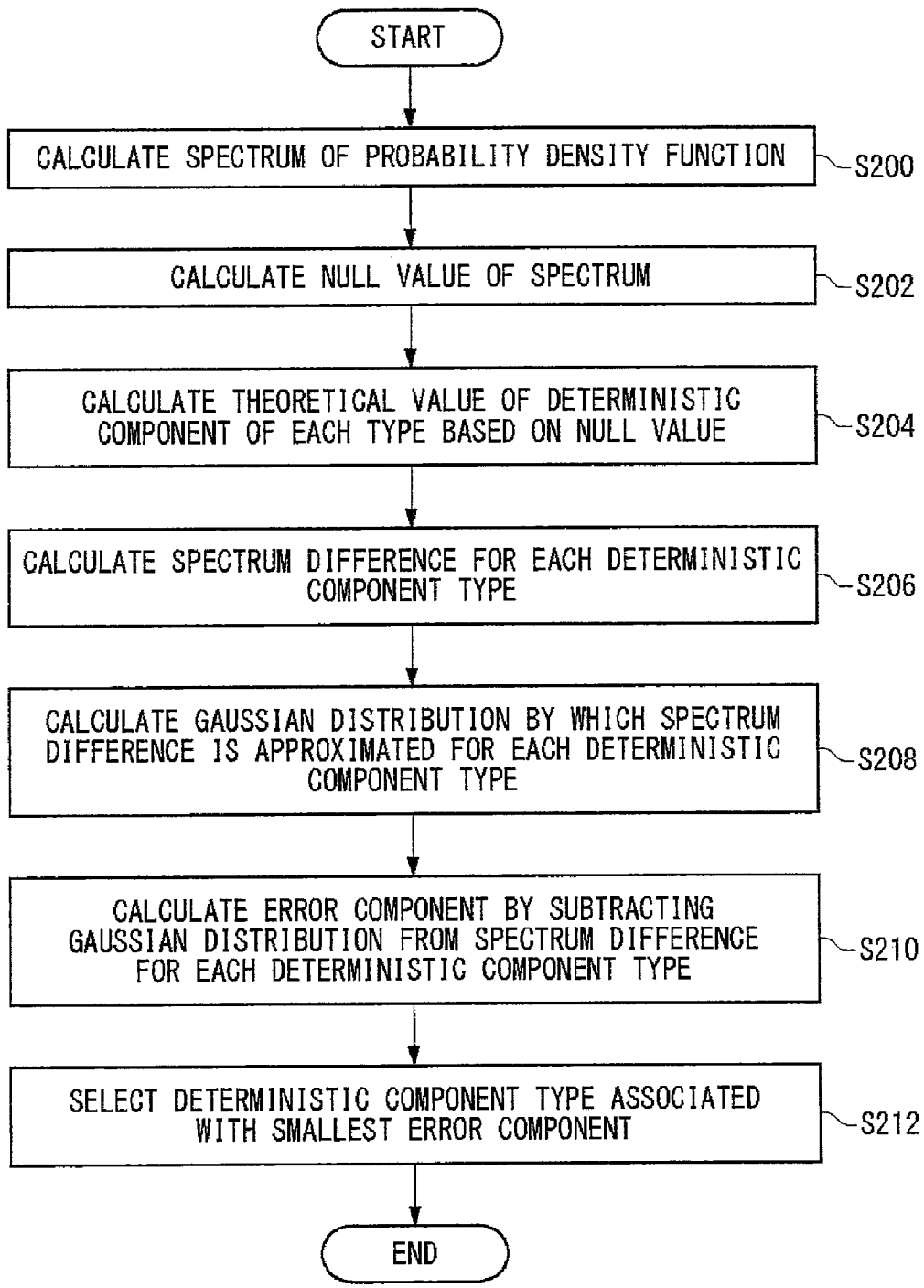
FIG. 11 is a flow chart briefly illustrating the operations performed by the deterministic component model identifying apparatus 100.

FIG. 11 is a flow chart briefly illustrating the operations performed by the deterministic component model identifying apparatus 100. As discussed above, the spectrum calculating section 10 calculates a spectrum of a supplied probability density function (step S200). Subsequently, the null value detecting section 20 detects a first null value in the spectrum calculated by the spectrum calculating section 10 (step S202).

After this, the theoretical value calculating section 30 calculates a theoretical value of a deterministic component spectrum based on the first null value, in association with each predetermined deterministic component type (step S206). Following this, the spectrum difference calculating section 42 calculates a logarithmic magnitude spectrum difference for each deterministic component type (step S208).

Subsequently, the error calculating section 44 obtains, for each deterministic component type, a Gaussian distribution by which the logarithmic magnitude spectrum difference is approximated (step S208). If the spectra are transformed into logarithms and the logarithmic magnitude spectrum difference is then calculated, a quadratic curve can be used as a logarithmic magnitude spectrum of a Gaussian distribution. In this manner, the logarithmic magnitude spectrum difference can be easily approximated by a Gaussian distribution.

After this, the error calculating section 44 calculates, for each deterministic component type, a residual error by subtracting the approximation Gaussian distribution from the logarithmic magnitude spectrum difference (step S210). Following this, the selecting section 46 selects a deterministic component type that produces the smallest residual error (step S212). In the above-described manner, the deterministic component model identifying apparatus 100 can estimate the type of the deterministic component contained in the probability density function.

Figure 12:
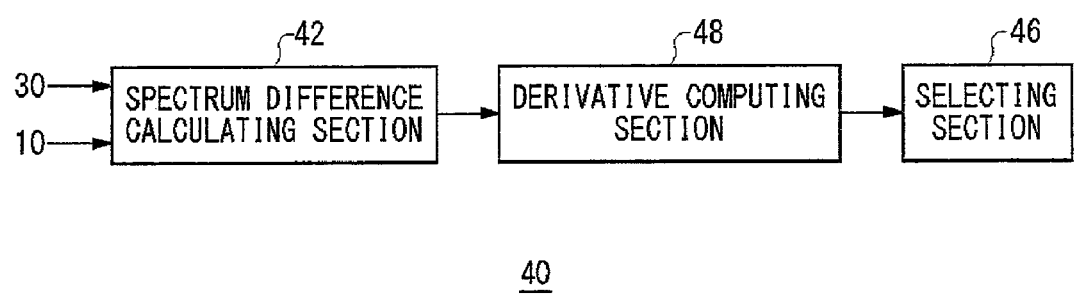
FIG. 12 illustrates another exemplary configuration of the model determining section 40.

FIG. 12 illustrates another exemplary configuration of the model determining section 40. According to the present example, the model determining section 40 selects a particular deterministic component type as the type of the deterministic component contained in the probability density function, based on the second-order derivative of the logarithmic magnitude spectrum difference for each deterministic component type with respect to a predetermined variable axis. The following describes an exemplary case where the model determining section 40 computes the second-order derivative of the logarithmic magnitude spectrum difference with respect to the frequency.

According to the present example, the model determining section 40 includes the spectrum difference calculating section 42, a derivative computing section 48, and the selecting section 46. The spectrum difference calculating section 42 may be the same as the spectrum difference calculating section 42 described with reference to FIGS. 1 to 11. For example, the spectrum difference calculating section 42 calculates, for each deterministic component type, the logarithmic magnitude spectrum difference described with reference to Equation 4.

The derivative computing section 48 computes the second-order derivative of the logarithmic magnitude spectrum difference for each deterministic component type, with respect to a second-order difference or frequency. As a result, the logarithmic magnitude spectrum difference, the random component and the residual error are related to each other as indicated by the following equation.

$$\frac{\partial^2}{\partial f^2}(\log_e H(f) - \log_e D(f)) = -\frac{1}{\sigma_f^2} + \text{error} \qquad \text{Equation 6}$$

In the above-described manner, the term representing the random component can be approximated by a constant number.

Figure 13:
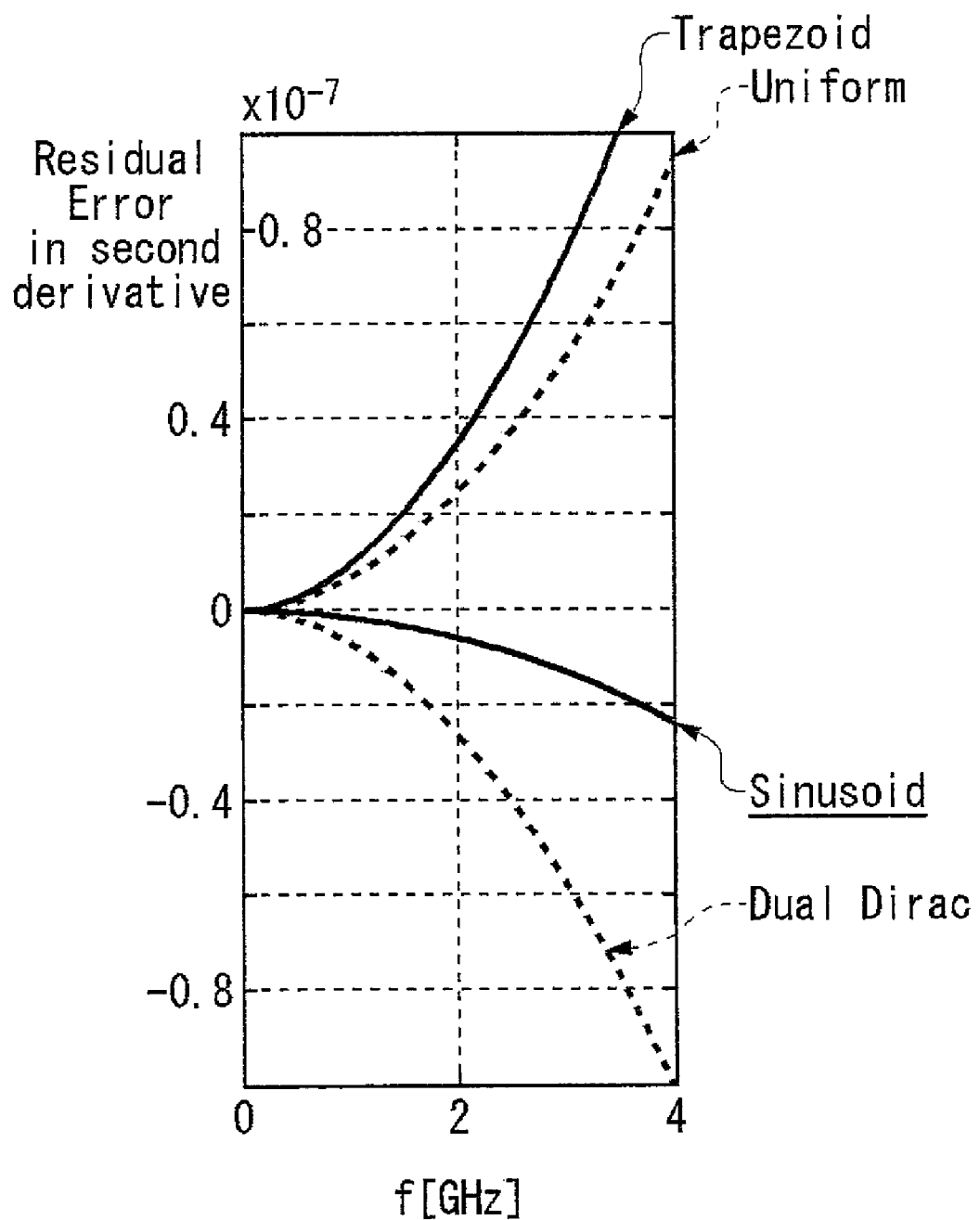
FIG. 13 illustrates a spectrum difference calculated by a derivative computing section 48 for each deterministic component type.

FIG. 13 illustrates the logarithmic magnitude spectrum difference calculated by the derivative computing section 48 for each deterministic component type. Note that FIG. 13 only shows the residual error, by removing the constant number term representing the random component from the logarithmic magnitude spectrum difference. The selecting section 46 may estimate the type of the deterministic component contained in the probability density function, based on the logarithmic magnitude spectrum differences yielded by the derivative computing section 48. Note that, however, the logarithmic magnitude spectrum difference calculated by the derivative computing section 48 still contains the constant number term representing the random component, as seen from Equation 6.

Therefore, the selecting section 46 may calculate the absolute value of the peak-to-peak value of each logarithmic magnitude spectrum difference within a predetermined range of the variable axis (in the present example, the frequency axis). It is preferable that the lower limit value of the predetermined range is greater than 0 and the upper limit value is sufficiently smaller than the first null value. For example, the selecting section 46 may calculate the peak-to-peak value for each logarithmic magnitude spectrum difference within a range whose upper limit value is approximately 1/8 of the first null value.

In the exemplary case shown in FIG. 13, when a frequency range is defined as 0<f<4 GHz, the peak-to-peak value for a sinusoidal distribution is $-0.2 \times 10^{-7}$, the peak-to-peak value for a uniform distribution is $0.9'10^{-7}$, and the peak-to-peak value of a dual-Dirac distribution is $-0.9 \times 10^{-7}$. In this case, the peak-to-peak value associated with a deterministic component having a sinusoidal distribution has the smallest absolute value, and the selecting section 46 can determine that the probability density function contains a deterministic component having a sinusoidal distribution.

Figure 14:
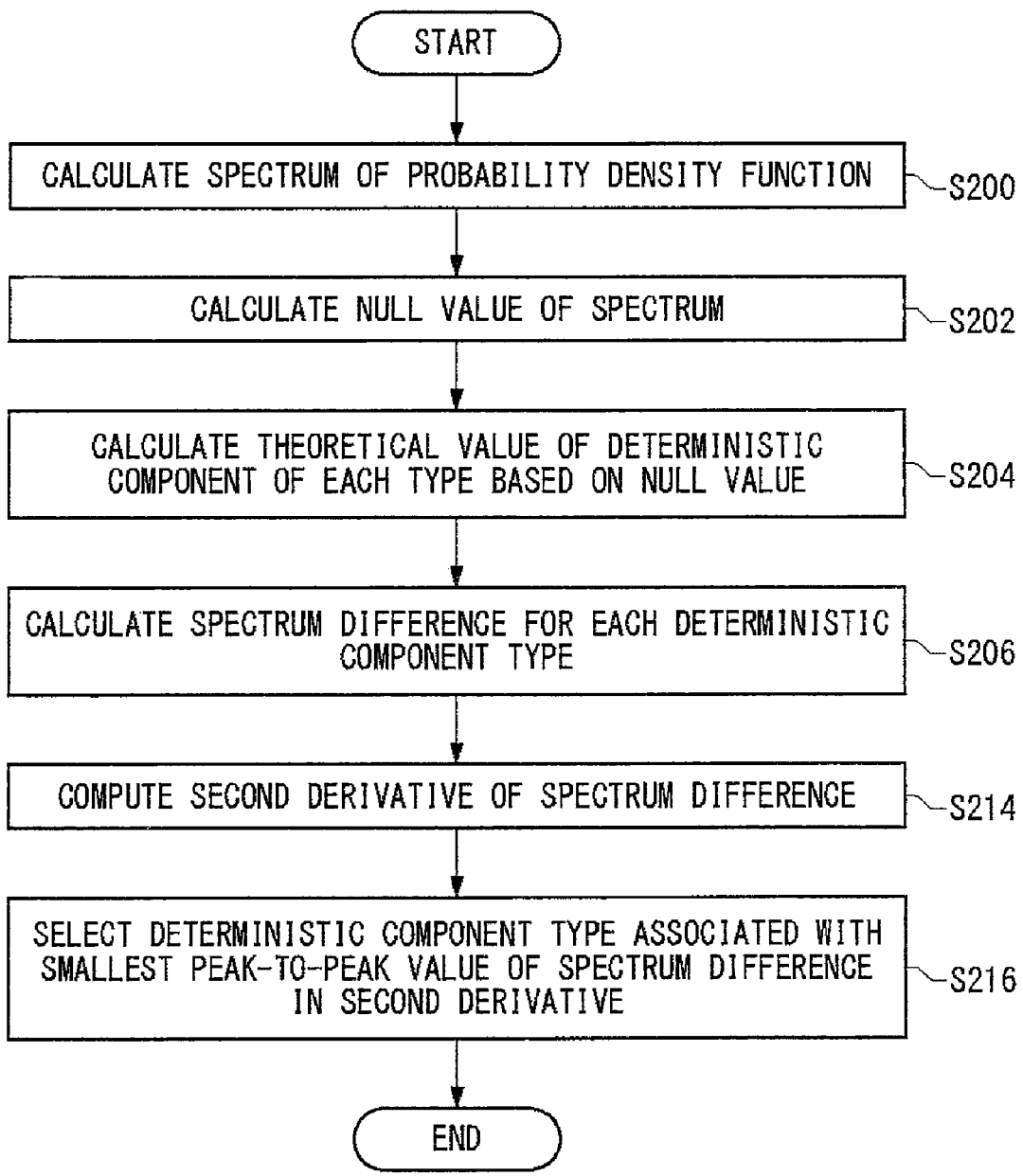
FIG. 14 is a flow chart briefly illustrating the operations performed by the deterministic component model identifying apparatus 100 described with reference to FIGS. 12 and 13.

FIG. 14 is a flow chart briefly illustrating the operations performed by the deterministic component model identifying apparatus 100 described with reference to FIGS. 12 and 13. According to the present example, the operations from the step S200 to the step S206 may be the same as those described with reference to FIG. 11.

After the operation in the step S206, the derivative computing section 48 computes the second-order derivative of each logarithmic magnitude spectrum difference with respect to the frequency (step S214). The selecting section 46 then selects a deterministic component type that is associated with the smallest absolute value among the absolute values of the peak-to-peak values for the second-order derivatives of the logarithmic magnitude spectrum differences (step S216). In the above-described manner, the deterministic component model identifying apparatus 100 can also estimate the type of the deterministic component contained in the probability density function.

FIGS. 15A, 16A, 17A and 18A each illustrate a spectrum of a probability density function containing a different type of deterministic component and a theoretical value of a spectrum of a deterministic component of each type. FIGS. 15B, 16B, 17B and 18B respectively illustrate a residual error calculated in the manner described with reference to FIG. 11 in the exemplary cases shown in FIGS. 15A, 16A, 17A and 18A. FIGS. 15C, 16C, 17C and 18C respectively illustrate a logarithmic magnitude spectrum difference calculated in the manner described with reference to FIG. 14 in the exemplary cases shown in FIGS. 15A, 16A, 17A and 18A.

Figure 15A:
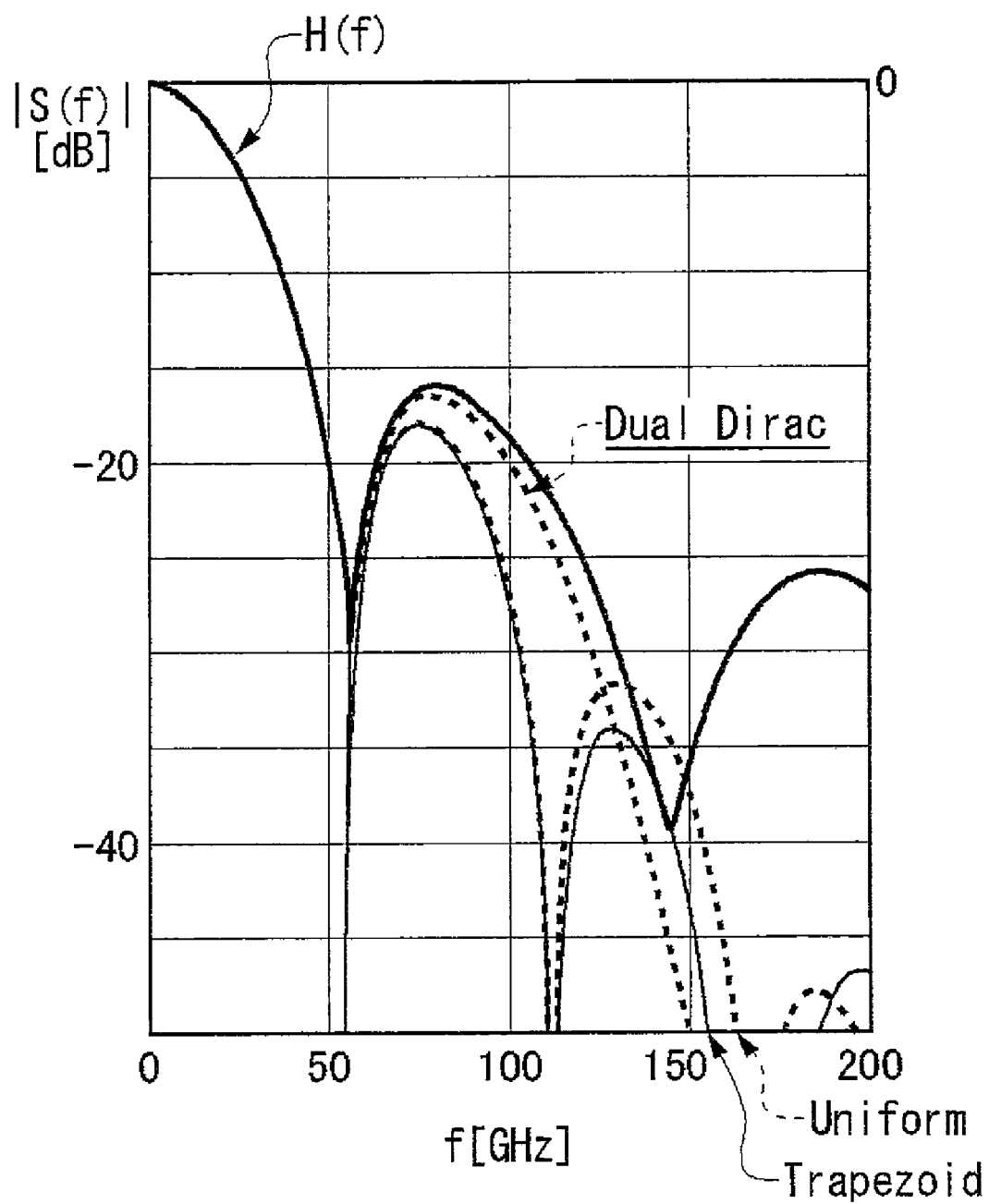
FIG. 15A illustrates a spectrum of a probability density function containing a different type of deterministic component and a theoretical value of a spectrum of a deterministic component of each type.
Figure 15B:
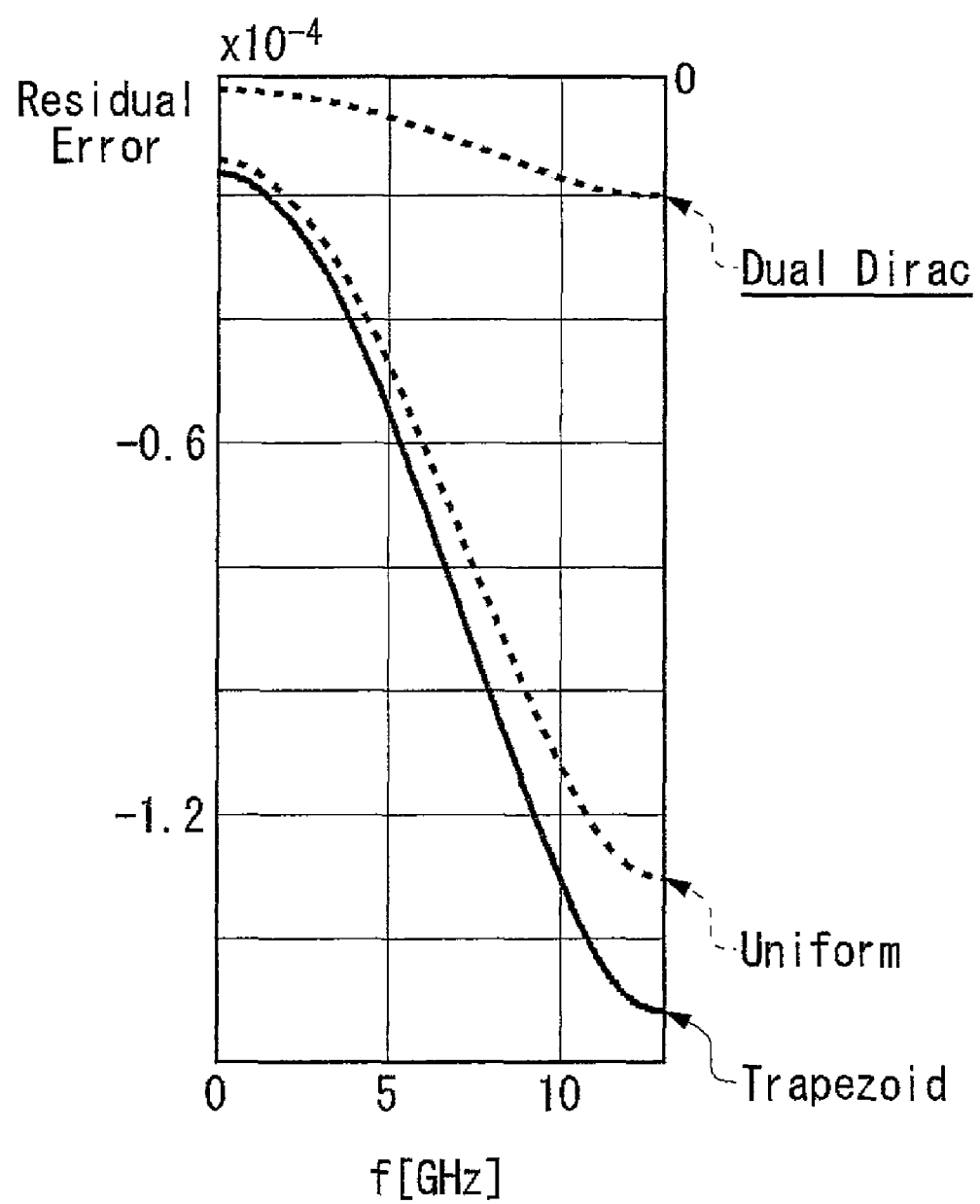
FIG. 15B illustrates a residual error calculated in the manner described with reference to FIG. 11 in the exemplary case shown in FIG. 15A.
Figure 15C:
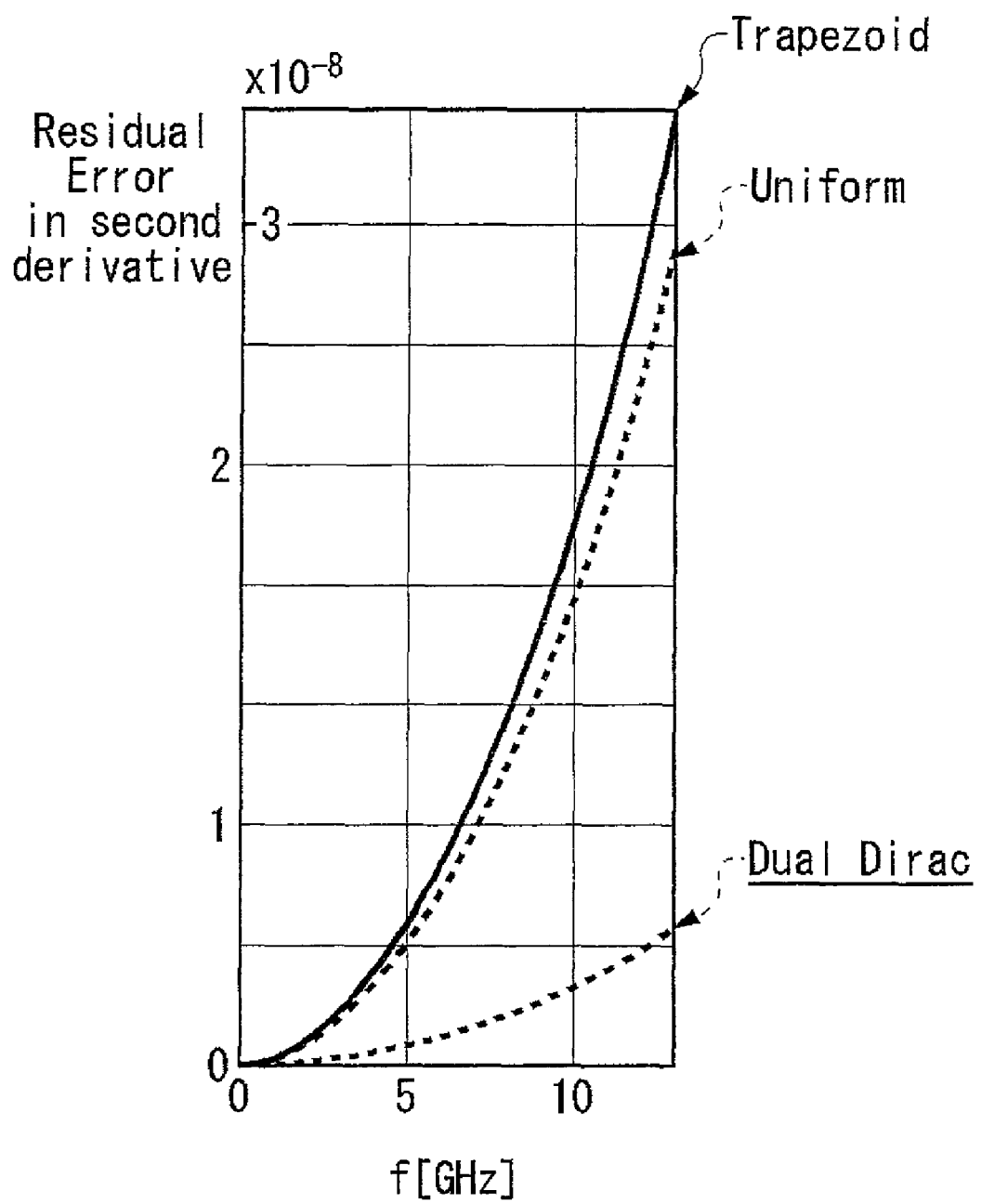
FIG. 15C illustrates a spectrum difference calculated in the manner described with reference to FIG. 14 in the exemplary case shown in FIG. 15A.
Figure 16A:
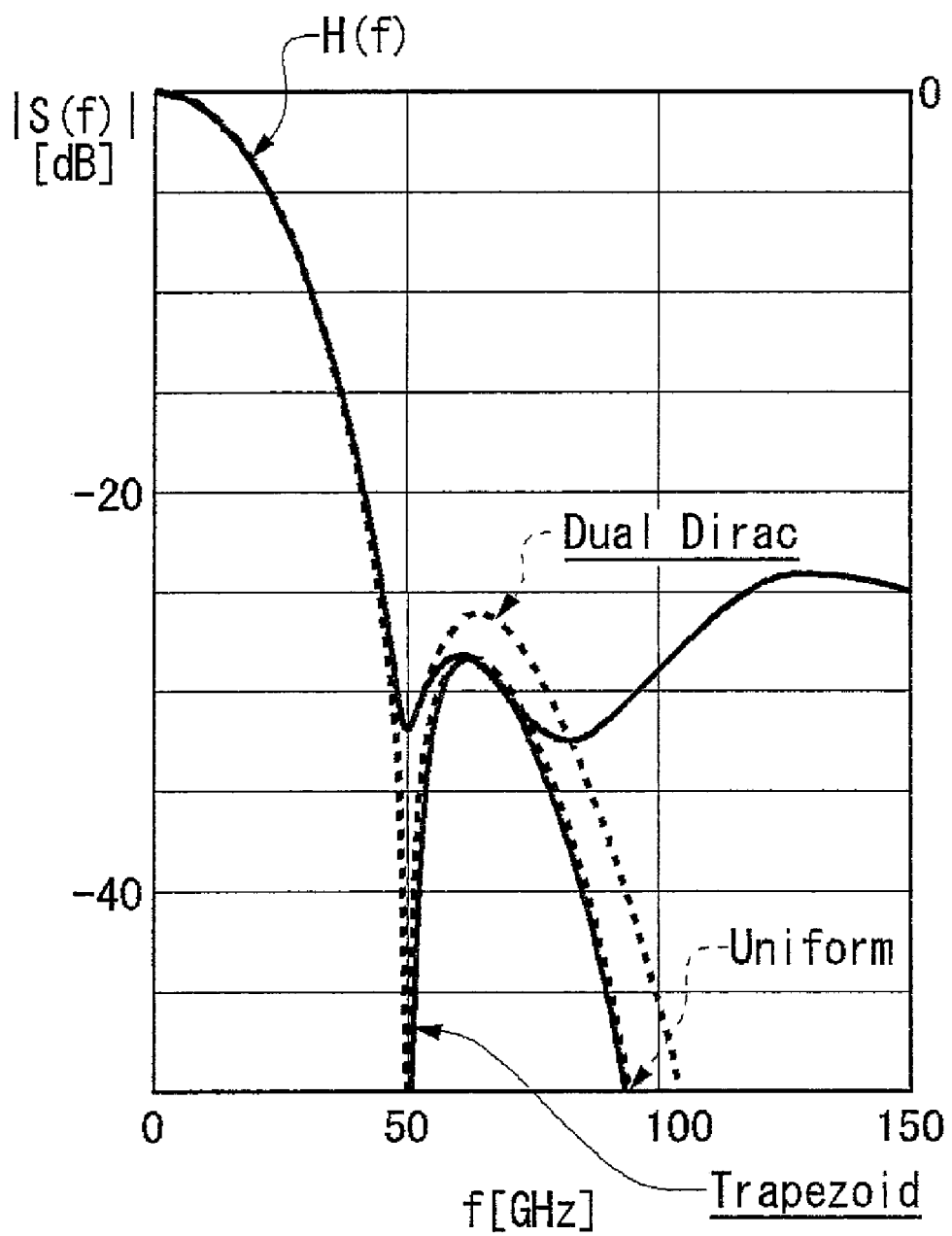
FIG. 16A illustrates a spectrum of a probability density function containing a different type of deterministic component and a theoretical value of a spectrum of a deterministic component of each type.
Figure 16B:
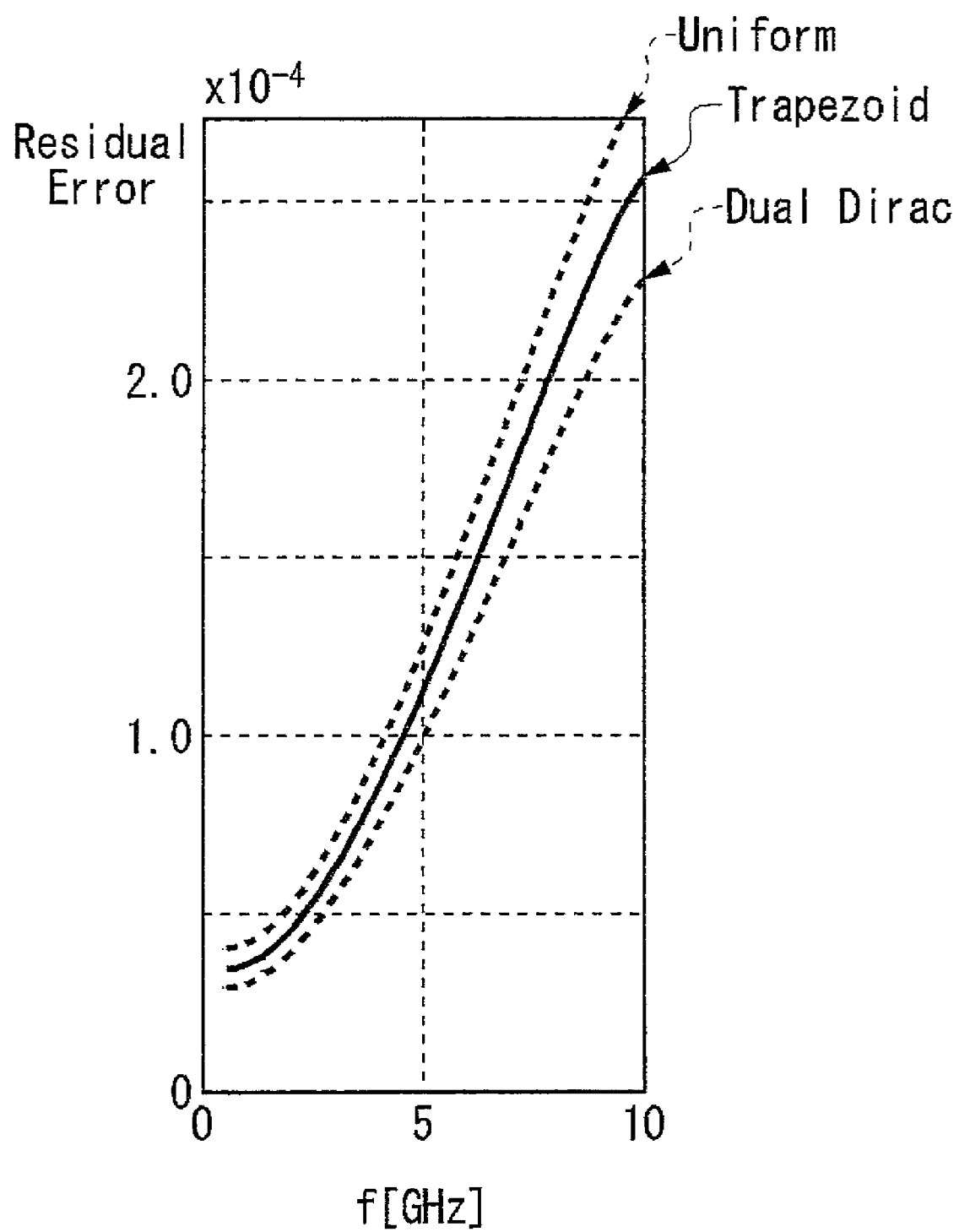
FIG. 16B illustrates a residual error calculated in the manner described with reference to FIG. 11 in the exemplary case shown in FIG. 16A.
Figure 16C:
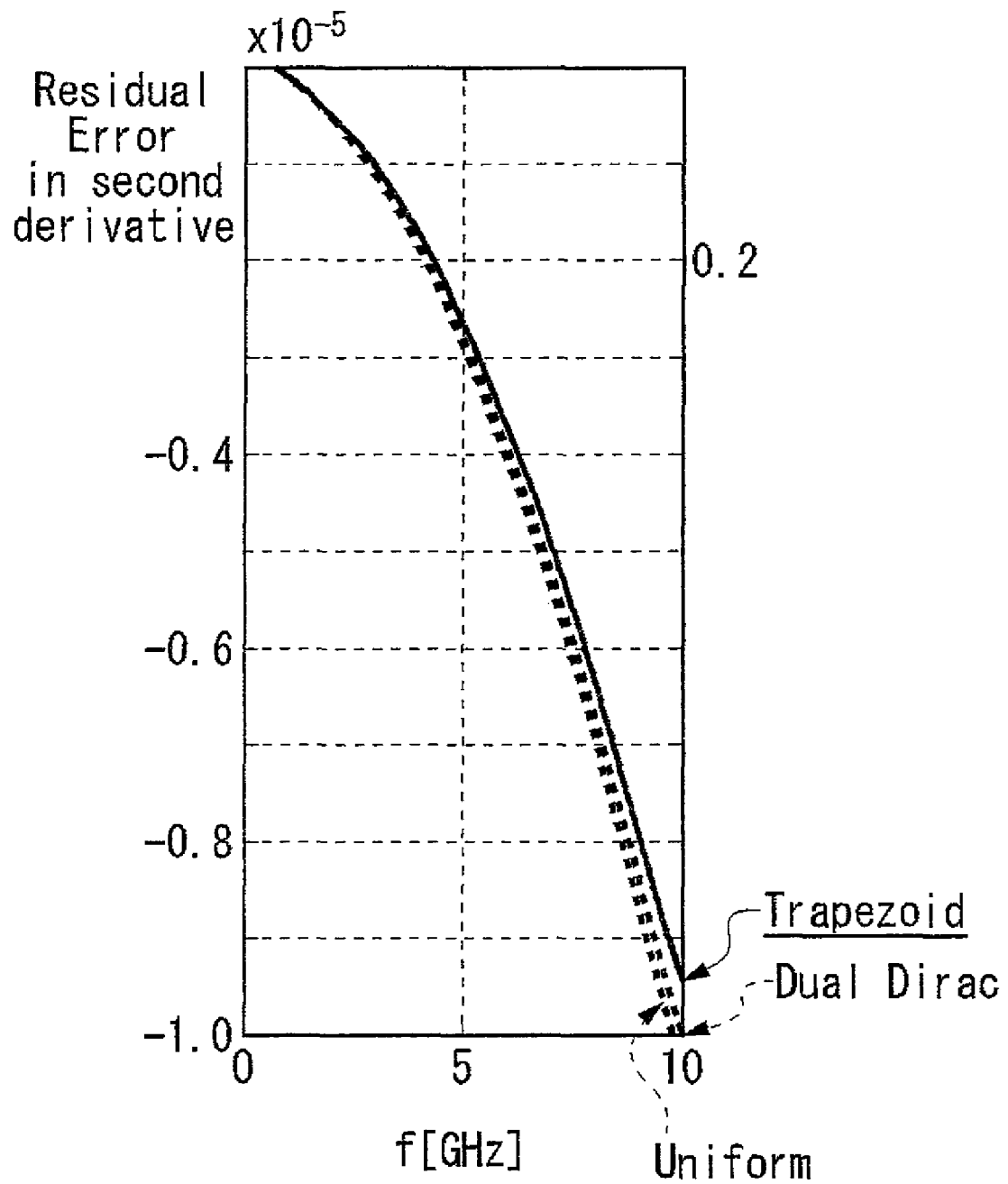
FIG. 16C illustrates a spectrum difference calculated in the manner described with reference to FIG. 14 in the exemplary case shown in FIG. 16A.
Figure 17A:
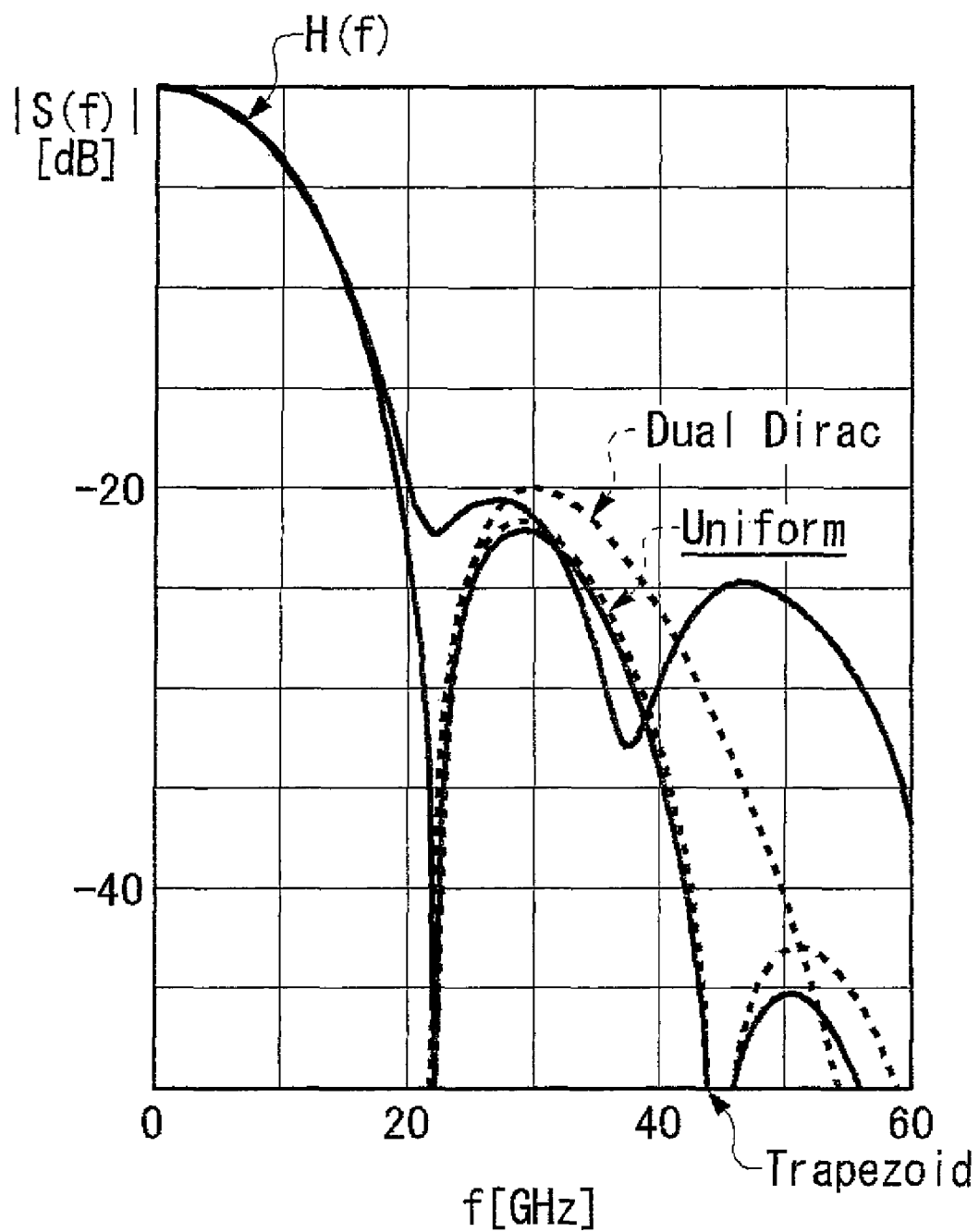
FIG. 17A illustrates a spectrum of a probability density function containing a different type of deterministic component and a theoretical value of a spectrum of a deterministic component of each type.
Figure 17B:
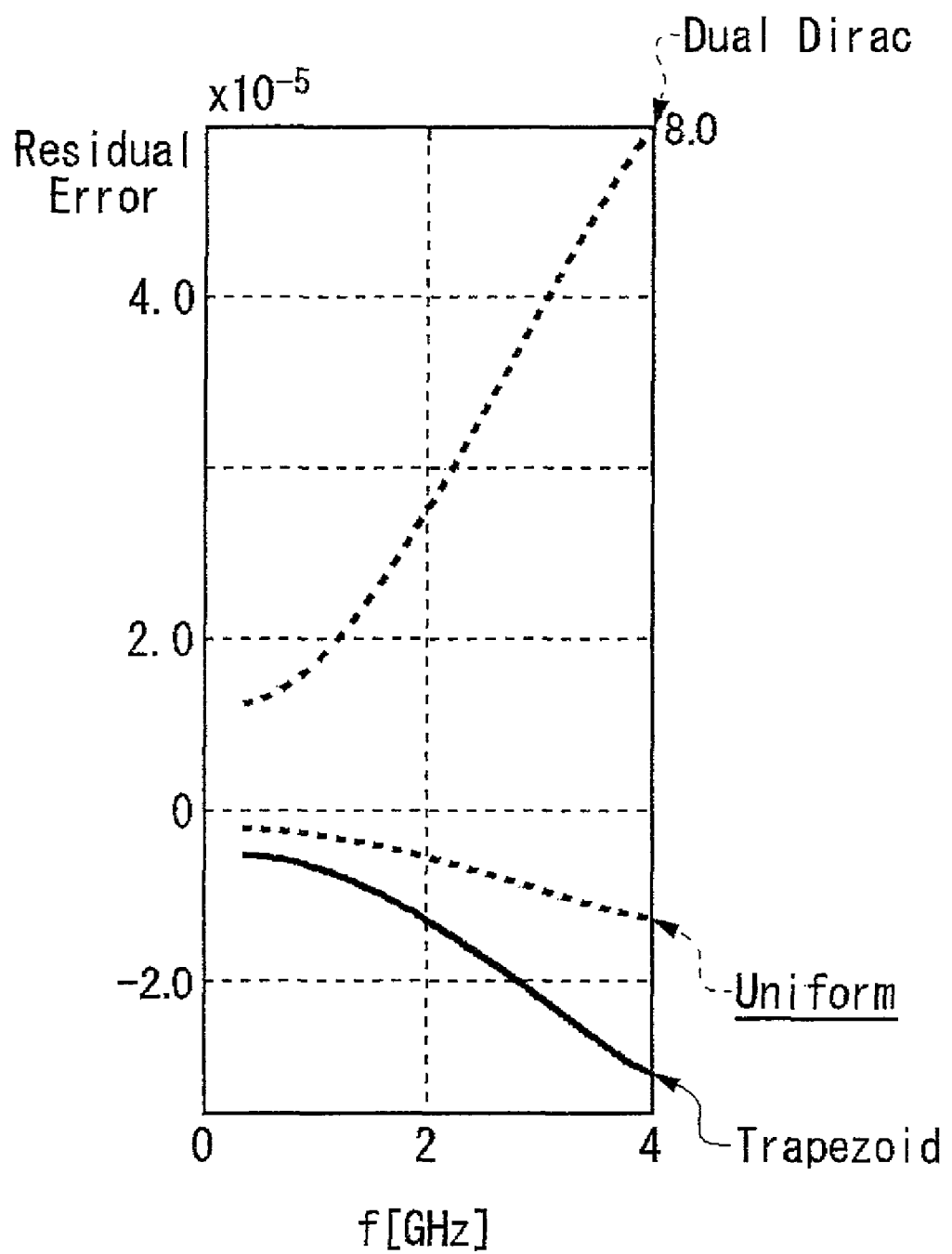
FIG. 17B illustrates a residual error calculated in the manner described with reference to FIG. 11 in the exemplary case shown in FIG. 17A.
Figure 17C:
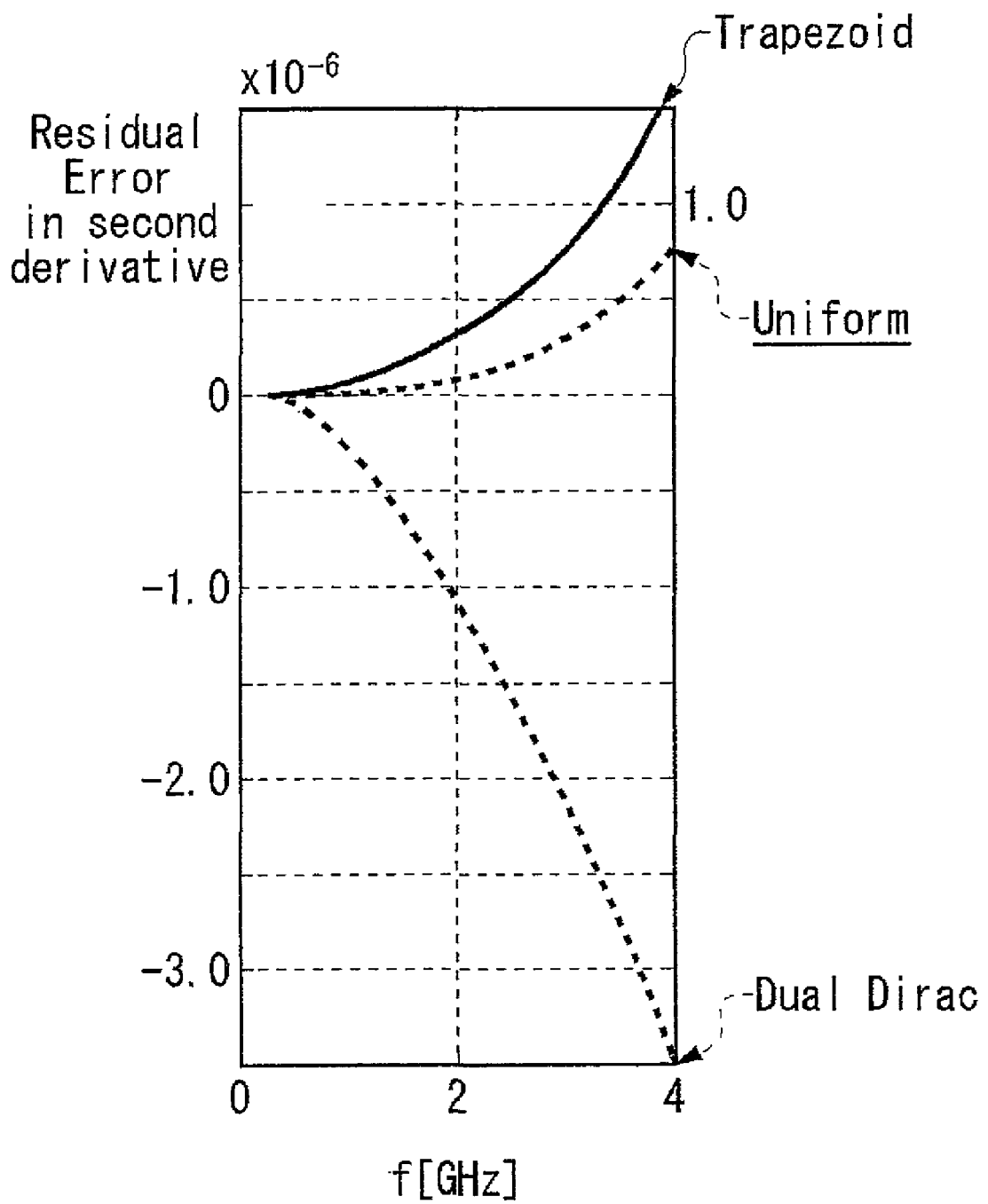
FIG. 17C illustrates a spectrum difference calculated in the manner described with reference to FIG. 14 in the exemplary case shown in FIG. 17A.
Figure 18A:
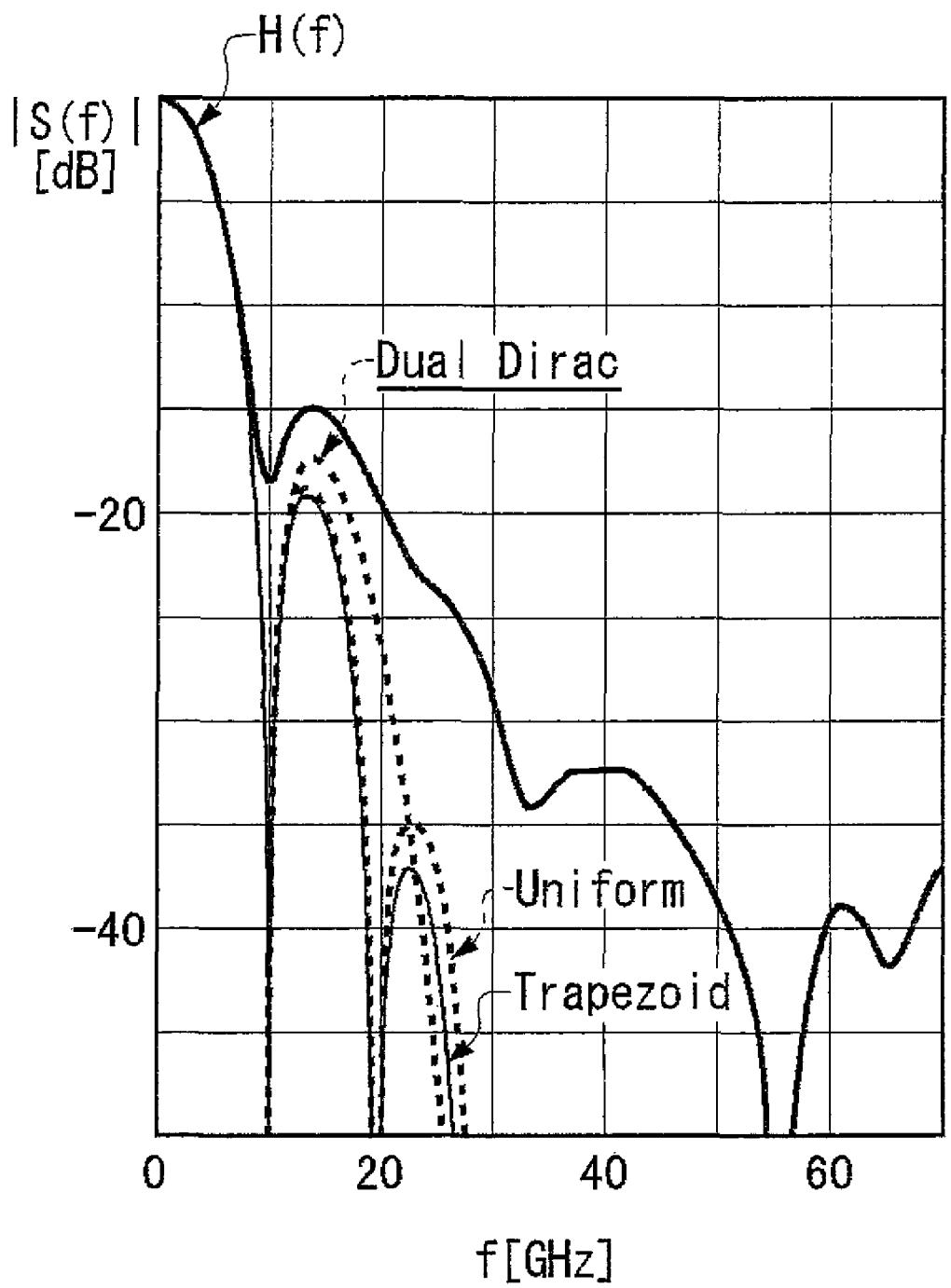
FIG. 18A illustrates a spectrum of a probability density function containing a different type of deterministic component and a theoretical value of a spectrum of a deterministic component of each type.
Figure 18B:
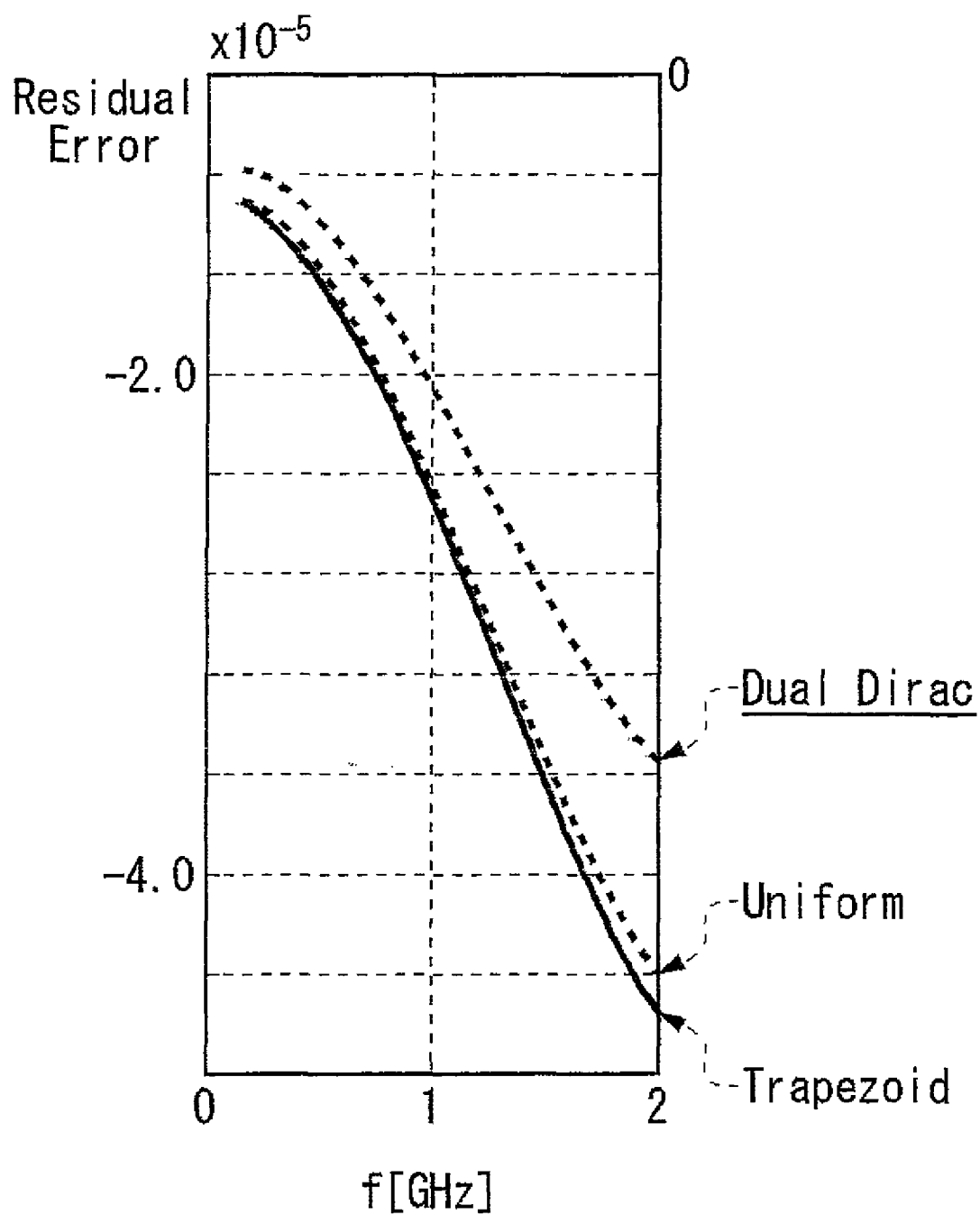
FIG. 18B illustrates a residual error calculated in the manner described with reference to FIG. 11 in the exemplary case shown in FIG. 18A.
Figure 18C:
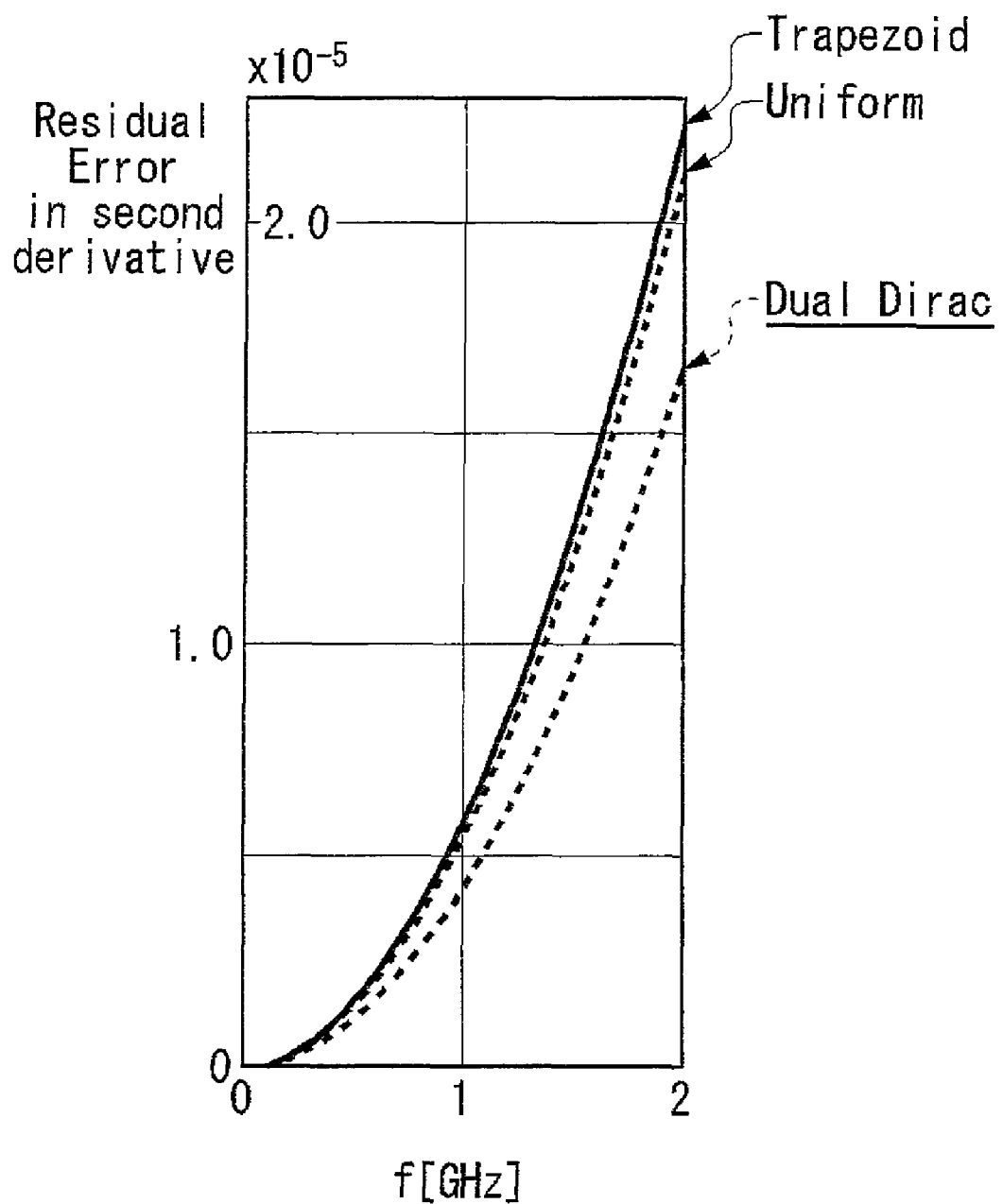
FIG. 18C illustrates a spectrum difference calculated in the manner described with reference to FIG. 14 in the exemplary case shown in FIG. 18A.

FIGS. 15A to 15C illustrate an exemplary case where deterministic jitter having a dual-Dirac distribution is injected into a signal generated by a 7-stage pseudo random sequence generator. FIGS. 16A to 16C illustrate an exemplary case where deterministic jitter having a dual-Dirac distribution is injected into a signal transmitted through a 0.7-meter-long cable. FIGS. 17A to 17C illustrate an exemplary case where deterministic jitter having a uniform distribution is injected into a signal transmitted through a 10-meter-long cable. FIGS. 18A to 18C illustrate an exemplary case where deterministic jitter having a dual-Dirac distribution is injected into a signal transmitted through a 20-meter-long cable. As is apparent from the above, the deterministic component model identifying apparatus 100 can estimate the type of the deterministic component by using either one of the methods described with reference to FIGS. 11 and 14.

Figure 19:
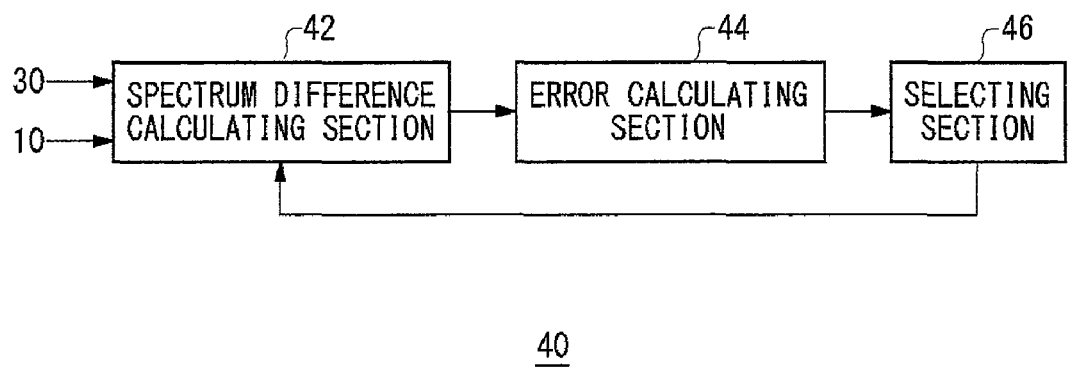
FIG. 19 illustrates another exemplary functional configuration of the model determining section 40.

FIG. 19 illustrates another exemplary functional configuration of the model determining section 40. The model determining section 40 relating to the present example is designed for dealing with a case where a probability density function contains a plurality of types of deterministic components, and determines the plurality of types of deterministic components. Referring to the exemplary case shown in FIGS. 16A to 16C, for example, the residual errors are only slightly different from each other among the different deterministic component types. In such a case, the probability density function may possibly contain a plurality of different types of deterministic components.

The model determining section 40 relating to the present example includes the spectrum difference calculating section 42, the error calculating section 44, and the selecting section 46, similarly to the model determining section 40 described with reference to FIG. 8. First of all, the spectrum difference calculating section 42, the error calculating section 44, and the selecting section 46 determines a type of a first deterministic component contained in the probability density function, in the same manner as the model determining section 40 described with reference to FIG. 8.

Subsequently, the spectrum difference calculating section 42 calculates a subtraction spectrum by subtracting the spectrum of the first deterministic component whose type is selected by the selecting section 46 from the spectrum of the probability density function. The spectrum difference calculating section 42 may calculate a logarithmic magnitude spectrum as the subtraction spectrum. The spectrum difference calculating section 42 performs the same series of operations on the subtraction spectrum, in place of the spectrum input into the model determining section 40 described with reference to FIG. 8.

Specifically speaking, the spectrum difference calculating section 42 calculates a logarithmic magnitude spectrum difference by subtracting a theoretical value from the subtraction spectrum, in association with each of the other deterministic component types than the type of the first deterministic component. The error calculating section 44 then calculates, in association with each deterministic component type, a residual error by subtracting a Gaussian distribution by which the calculated logarithmic magnitude spectrum difference is approximated from the calculated logarithmic magnitude spectrum difference. The selecting section 46 determines that a deterministic component type associated with the smallest residual error is the type of a second deterministic component contained in the probability density function.

The selecting section 46 may determine that the probability density function contains a plurality of different types of deterministic components when the residual error associated with a first deterministic component takes a value greater than a predetermined reference value, and notify the spectrum difference calculating section 42 of the first deterministic component type and a necessary second deterministic component type. In the above-described manner, the deterministic component model identifying apparatus 100 can deal with a case where a probability density function contains a plurality of different types of deterministic components, and can determine the types of the respective deterministic components.

Figure 20:
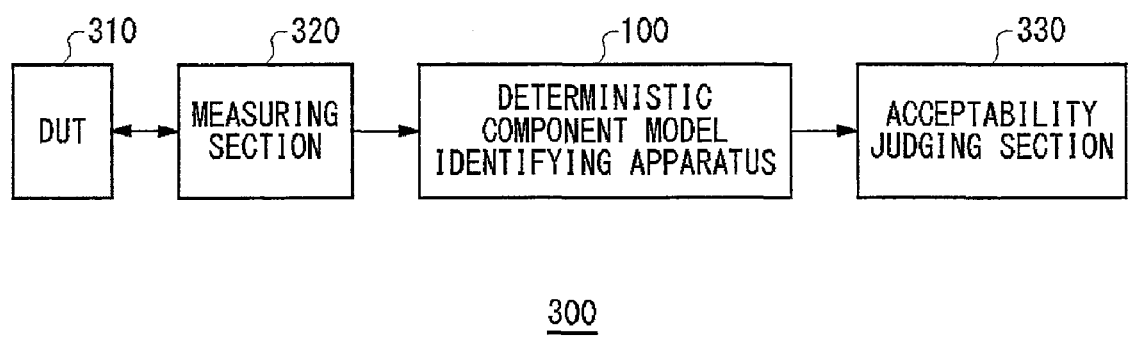
FIG. 20 illustrates an exemplary configuration of a test system 300 relating to an embodiment of the present invention.

FIG. 20 illustrates an exemplary configuration of a test system 300 relating to an embodiment of the present invention. The test system 300 is designed to test a device under test such as a semiconductor circuit or communication device. The test system 300 includes a measuring section 320, a deterministic component model identifying apparatus 100, and an acceptability judging section 330.

The measuring section 320 measures a predetermined characteristic of the device under test 310 multiple times and generates a probability density function of the measured values of the predetermined characteristic. For example, the measuring section 320 may measure the jitter, voltage, current or the like of the signal output from the device under test 310.

The deterministic component model identifying apparatus 100 determines the type of the deterministic component contained in the probability density function representing the characteristic values measured by the measuring section 320. The deterministic component model identifying apparatus 100 may calculate at least one of the deterministic and random components contained in the probability density function.

For example, the deterministic component model identifying apparatus 100 may calculate the probability density function or peak-to-peak value of the deterministic component as shown in FIG. 7, by referring to the first null frequency and the type of the deterministic component. Alternatively, the deterministic component model identifying apparatus 100 may calculate the probability density function or standard deviation of the random component according to the identified deterministic component type.

The acceptability judging section 330 judges whether the device under test 310 is acceptable based on the deterministic or random component calculated by the deterministic component model identifying apparatus 100. For example, the acceptability judging section 330 may judge whether one of the deterministic and random components calculated by the deterministic component model identifying apparatus 100 satisfies a predetermined specification. With the above-described configuration, the test system 300 can accurately judge the acceptability of the device under test 310.

Figure 21:
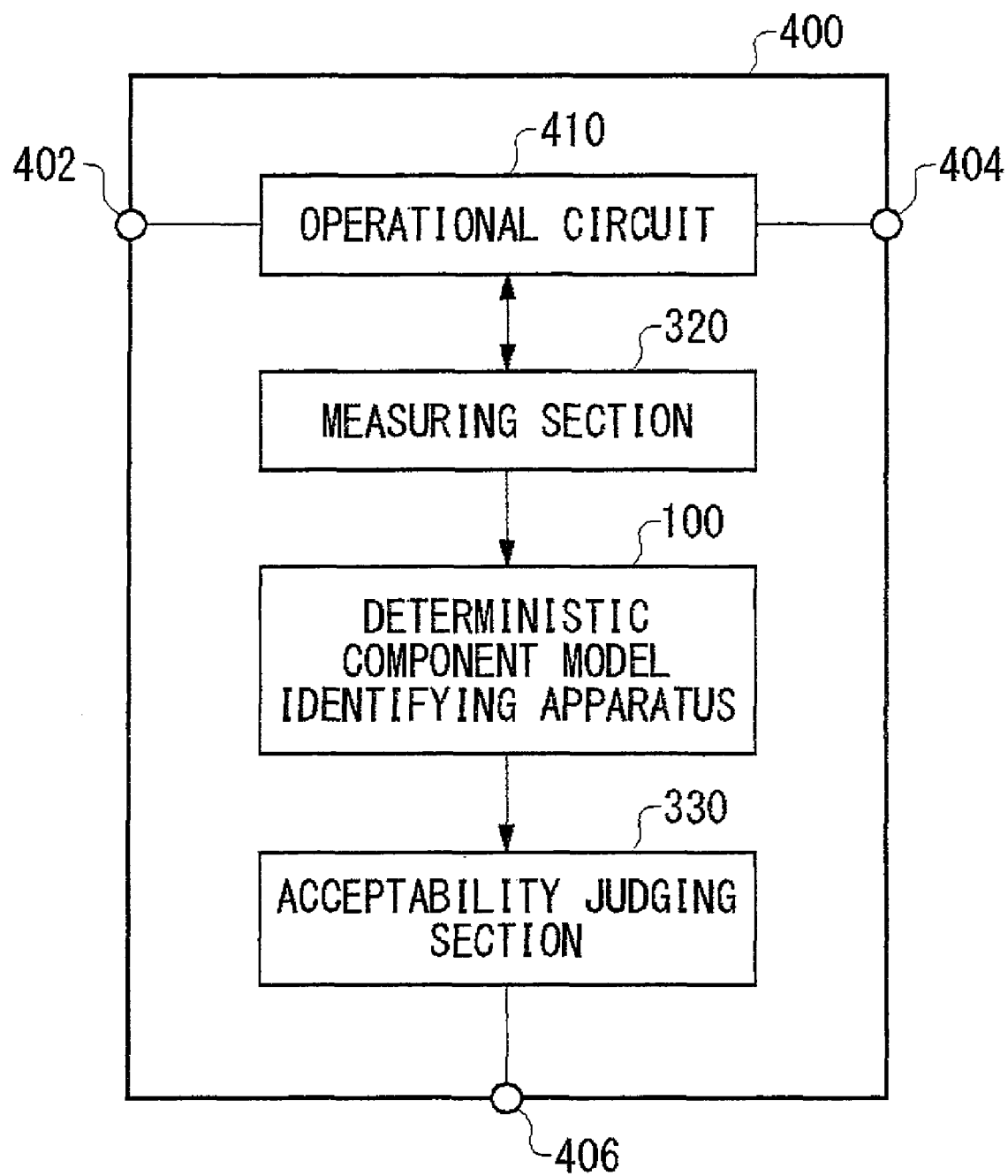
FIG. 21 illustrates an exemplary configuration of an electronic device 400 relating to an embodiment of the present invention.

FIG. 21 illustrates an exemplary configuration of an electronic device 400 relating to an embodiment of the present invention. According to the present example, the electronic device 400 operates in accordance with a signal supplied through an input pin 402, and outputs a generated predetermined signal thorough an output pin 404. The electronic device 400 includes an operational circuit 410, a measuring section 320, a deterministic component model identifying apparatus 100, and an acceptability judging section 330.

The operational circuit 410 operates in accordance with a signal supplied thereto. The operational circuit 410 may generate a predetermined signal as a result of the operation. The measuring section 320, the deterministic component model identifying apparatus 100, and the acceptability judging section 330 together function as a BIST circuit that is designed to test whether the operational circuit 410 correctly operates.

The measuring section 320 measures a predetermined characteristic of the predetermined signal generated by the operational circuit 410 multiple times, to generate a probability density function. The deterministic component model identifying apparatus 100 calculates the deterministic and random components contained in the probability density function generated by the measuring section 320.

The acceptability judging section 330 judges whether the operational circuit 410 is acceptable based on the deterministic and random components calculated by the deterministic component model identifying apparatus 100. The measuring section 320, the deterministic component model identifying apparatus 100, and the acceptability judging section 330 may be the same as the measuring section 320, the deterministic component model identifying apparatus 100, and the acceptability judging section 330 described with reference FIG. 20.

The acceptability judging section 330 may output the result of the judgment as to whether the operational circuit 410 is acceptable to outside through a test pin 406. With the above-described configuration, the electronic device 400 can accurately self-diagnose the operational circuit 410.

Figure 22:
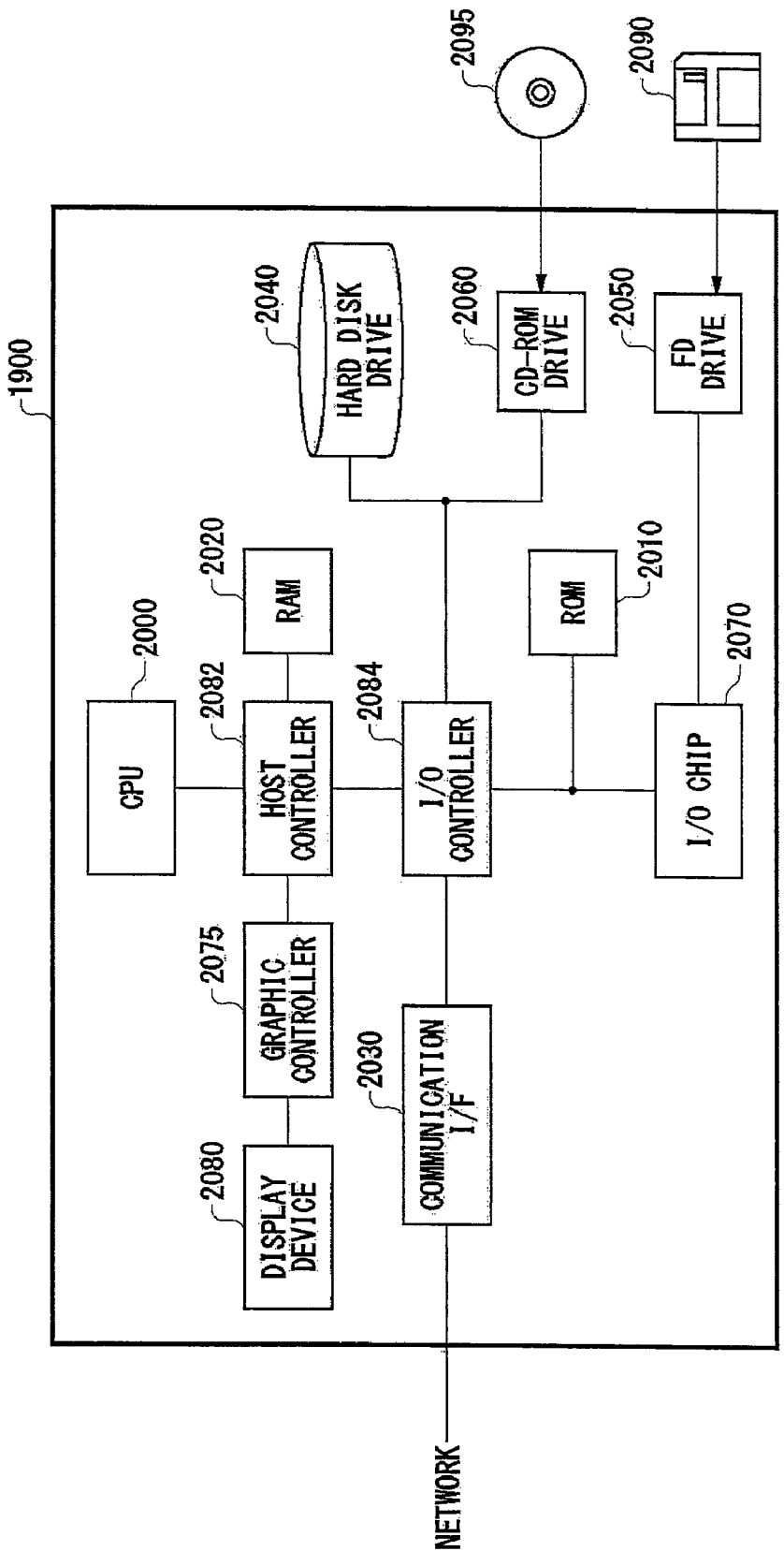
FIG. 22 illustrates an exemplary hardware configuration of a computer 1900 relating to an embodiment of the present invention.

FIG. 22 illustrates an exemplary hardware configuration of a computer 1900 relating to an embodiment of the present invention. The computer 1900 functions as the deterministic component model identifying apparatus 100 described with reference to FIGS. 1 to 19 in accordance with programs supplied thereto. The programs may cause the computer 1900 to function as the respective constituents of the deterministic component model identifying apparatus 100 described with reference to FIGS. 1 to 19.

The computer 1900 relating to the present embodiment is constituted by a CPU peripheral section, an input/output (I/O) section and a legacy I/O section. The CPU peripheral section includes a CPU 2000, a RAM 2020, a graphic controller 2075 and a display device 2080 which are connected to each other by means of a host controller 2082. The I/O section includes a communication interface 2030, a hard disk drive 2040, and a CD-ROM drive 2060 which are connected to the host controller 2082 by means of an I/O controller 2084. The legacy I/O section includes a ROM 2010, a flexible disk drive 2050, and an I/O chip 2070 which are connected to the I/O controller 2084.

The host controller 2082 connects the RAM 2020 with the CPU 2000 and graphic controller 2075 which access the RAM 2020 at a high transfer rate. The CPU 2000 operates in accordance with programs stored on the ROM 2010 and RAM 2020, to control the constituents. The graphic controller 2075 obtains image data which is generated by the CPU 2000 or the like on a frame buffer provided within the RAM 2020, and causes the display device 2080 to display the obtained image data. Alternatively, the graphic controller 2075 may include therein a frame buffer for storing thereon the image data generated by the CPU 2000 or the like.

The I/O controller 2084 connects, to the host controller 2082, the hard disk drive 2040, communication interface 2030 and CD-ROM drive 2060 which are I/O devices operating at a relatively high rate. The communication interface 2030 communicates with different apparatuses via the network. The hard disk drive 2040 stores thereon programs and data to be used by the CPU 2000 in the computer 1900. The CD-ROM drive 2060 reads programs or data from a CD-ROM 2095, and supplies the read programs or data to the hard disk drive 2040 via the RAM 2020.

The I/O controller 2084 is also connected to the ROM 2010, flexible disk drive 2050 and I/O chip 2070 which are I/O devices operating at a relatively low rate. The ROM 2010 stores thereon a boot program executed by the computer 1900 at the startup, programs dependent on the hardware of the computer 1900, and the like. The flexible disk drive 2050 reads programs or data from a flexible disk 2090, and supplies the read programs or data to the hard disk drive 2040 via the RAM 2020. The I/O chip 2070 is connected to the flexible disk drive 2050, and used to connect a variety of I/O devices to the computer 1900, via a parallel port, a serial port, a keyboard port, a mouse port or the like.

The programs to be provided to the hard disk drive 2040 via the RAM 2020 are provided by a user in the state of being stored on a recording medium such as the flexible disk 2090, the CD-ROM 2095, and an IC card. The programs are read from the recording medium, and the read programs are installed in the hard disk drive 2040 in the computer 1900 via the RAM 2020, to be executed by the CPU 2000. The programs are installed in the computer 1900 and cause the computer 1900 to function as the deterministic component model identifying apparatus 100 when executed by the CPU 2000 and the like.

The programs mentioned above may be stored on an external recording medium. Such a recording medium is, for example, an optical recording medium such as DVD and CD, a magnet-optical recording medium such as MO, a tape medium, a semiconductor memory such as an IC card and the like, in addition to the flexible disk 2090 and CD-ROM 2095. Alternatively, the recording medium may be a storage device such as a hard disk or RAM which is provided in a server system connected to a dedicated communication network or the Internet, and the programs may be provided to the computer 1900 via the network.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

As is apparent from the above description, an embodiment of the present invention can realize a deterministic component model identifying apparatus that can accurately determine the type of a deterministic component contained in a probability density function.

What is claimed is:

1. A deterministic component model identifying apparatus for determining a type of a deterministic component contained in a probability density function supplied thereto, comprising:
one or more processors that cause the deterministic component model identifying apparatus to perform operations comprising:
calculating a spectrum of the probability density function on an axis of a predetermined variable;
detecting a first null value on the axis of the predetermined variable in the calculated spectrum;
calculating theoretical values of a spectrum of the deterministic component based on the detected first null value, each of the theoretical values corresponding to one of a plurality of predetermined deterministic component types; and
determining the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the calculated spectrum, the determining including:
calculating, in association with each of the plurality of predetermined deterministic component types, a logarithmic magnitude spectrum difference by subtracting the theoretical value of the spectrum of the deterministic component from the calculated spectrum;
approximating, in association with each of the plurality of predetermined deterministic component types, the logarithmic magnitude spectrum difference by a quadratic curve and calculating, in association with each of the plurality of predetermined deterministic component types, a residual error by removing a component of the quadratic curve from the logarithmic magnitude spectrum difference; and
selecting, as the type of the deterministic component contained in the probability density function, a deterministic component type associated with a smallest residual error from among the calculated residual errors.

2. A deterministic component model identifying apparatus for determining a type of a deterministic component contained in a probability density function supplied thereto, comprising:
one or more processors that cause the deterministic component model identifying apparatus to perform operations comprising:
calculating a spectrum of the probability density function on an axis of a predetermined variable;
detecting a first null value on the axis of the predetermined variable in the calculated spectrum;
calculating theoretical values of a spectrum of the deterministic component based on the detected first null value, each of the theoretical values corresponding to one of a plurality of predetermined deterministic component types; and
a model determining section that causes the one or more processors to determine the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the calculated spectrum, the determining including:
calculating, in association with each of the plurality of predetermined deterministic component types, a logarithmic magnitude spectrum difference by subtracting the theoretical value of the spectrum of the deterministic component from the calculated spectrum;
calculating, in association with each of the plurality of predetermined deterministic component types, a residual error by subtracting a component corresponding to the logarithmic magnitude spectrum of a Gaussian distribution from the logarithmic magnitude spectrum difference; and
detecting, in association with each of the plurality of predetermined deterministic component types, a value of a component closest to a DC component in the residual error, and selecting, as the type of the deterministic component contained in the probability density function, a deterministic component type associated with a smallest value among the detected values.

3. A deterministic component model identifying apparatus for determining a type of a deterministic component contained in a probability density function supplied thereto, comprising:

one or more processors that cause the deterministic component model identifying apparatus to perform operations comprising:

calculating a spectrum of the probability density function on an axis of a predetermined variable;

detecting a first null value on the axis of the predetermined variable in the calculated spectrum;

calculating theoretical values of a spectrum of the deterministic component based on the detected first null value, each of the theoretical values corresponding to one of a plurality of predetermined deterministic component types; and determining the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the calculated spectrum, the determining including:

calculating, in association with each of the plurality of predetermined deterministic component types, a logarithmic magnitude spectrum difference by subtracting the theoretical value of the spectrum of the deterministic component from the calculated spectrum; and selecting, as the type of the deterministic component contained in the probability density function, a deterministic component type associated with a logarithmic magnitude spectrum difference whose second-order derivative with respect to the predetermined variable exhibits a smallest peak-to-peak value within a predetermined range on the axis of the predetermined variable.

4. The deterministic component model identifying apparatus as set forth in claim 3, wherein the selecting includes calculating a peak-to-peak value of a second-order derivative of each logarithmic magnitude spectrum difference within a range whose upper limit value is smaller than the first null value on the axis of the predetermined variable.

5. A deterministic component model identifying method for determining a type of a deterministic component contained in a supplied probability density function, comprising:

calculating, by a deterministic component model identifying apparatus, a spectrum of the probability density function on an axis of a predetermined variable;

detecting, by the deterministic component model identifying apparatus, a first null value on the axis of the predetermined variable in the calculated spectrum;

calculating, by the deterministic component model identifying apparatus, theoretical values of a spectrum of the deterministic component based on the detected first null value, each of the theoretical values corresponding to one of a plurality of predetermined deterministic component types; and determining, by the deterministic component model identifying apparatus the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the calculated spectrum, the determining including:

calculating, in association with each of the plurality of predetermined deterministic component types, a logarithmic magnitude spectrum difference by subtracting the theoretical value of the spectrum of the deterministic component from the calculated spectrum;

approximating, in association with each of the plurality of predetermined deterministic component types, the logarithmic magnitude spectrum difference by a quadratic curve and calculating, in association with each of the plurality of predetermined deterministic component types, a residual error by removing a component of the quadratic curve from the logarithmic magnitude spectrum difference; and selecting, as the type of the deterministic component contained in the probability density function, a deterministic component type associated with a smallest residual error from among the calculated residual errors.

6. A non-transitory recording medium storing therein a program for causing a computer to function as a deterministic component model identifying apparatus for determining a type of a deterministic component contained in a probability density function supplied thereto, the program causing the computer to function as a deterministic component model identifying apparatus comprising:

a spectrum calculating section that calculates a spectrum of the probability density function on an axis of a predetermined variable;

a null value detecting section that detects a first null value on the axis of the predetermined variable in the calculated spectrum;

a theoretical value calculating section that calculates theoretical values of a spectrum of the deterministic component based on the first null value detected by the null value detecting section, each of the theoretical values corresponding to one of a plurality of predetermined deterministic component types; and a model determining section that determines the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the spectrum calculated by the spectrum calculating section, wherein the model determining section includes:

a spectrum difference calculating section that calculates, in association with each of the plurality of predetermined deterministic component types, a logarithmic magnitude spectrum difference by subtracting the theoretical value of the spectrum of the deterministic component from the spectrum calculated by the spectrum calculating section;

an error calculating section that, in association with each of the plurality of predetermined deterministic component types, approximates the logarithmic magnitude spectrum difference by a quadratic curve and calculates a residual error by removing a component of the quadratic curve from the logarithmic magnitude spectrum difference; and a selecting section that selects, as the type of the deterministic component contained in the probability density function, a deterministic component type associated with a smallest residual error from among the residual errors calculated by the error calculating section.

7. A test system for testing a device under test, comprising:
a measuring section that measures a predetermined characteristic of the device under test multiple times;
a deterministic component model identifying apparatus that determines a type of a deterministic component contained in a probability density function of the characteristic measured by the measuring section and calculates the deterministic component; and
an acceptability judging section that judges whether the device under test is acceptable, based on the deterministic component calculated by the deterministic component model identifying apparatus, wherein
the deterministic component model identifying apparatus includes:
a spectrum calculating section that calculates a spectrum of the probability density function on an axis of a predetermined variable;
a null value detecting section that detects a first null value on the axis of the predetermined variable in the calculated spectrum;
a theoretical value calculating section that calculates theoretical values of a spectrum of the deterministic component based on the first null value detected by the null value detecting section, each of the theoretical values corresponding to one of a plurality of predetermined deterministic component types; and
a model determining section that determines the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the spectrum calculated by the spectrum calculating section, wherein
the model determining section includes:
a spectrum difference calculating section that calculates, in association with each of the plurality of predetermined deterministic component types, a logarithmic magnitude spectrum difference by subtracting the theoretical value of the spectrum of the deterministic component from the spectrum calculated by the spectrum calculating section;
an error calculating section that, in association with each of the plurality of predetermined deterministic component types, approximates the logarithmic magnitude spectrum difference by a quadratic curve and calculates a residual error by removing a component of the quadratic curve from the logarithmic magnitude spectrum difference; and
a selecting section that selects, as the type of the deterministic component contained in the probability density function, a deterministic component type associated with a smallest residual error from among the residual errors calculated by the error calculating section.

8. An electronic device for generating a predetermined signal, comprising:
an operational circuit that generates the predetermined signal and outputs the predetermined signal;
a measuring section that measures a predetermined characteristic of the predetermined signal multiple times; and
a deterministic component model identifying apparatus that determines a type of a deterministic component contained in a probability density function of the characteristic measured by the measuring section and calculates the deterministic component, wherein
the deterministic component model identifying apparatus includes:
a spectrum calculating section that calculates a spectrum of the probability density function on an axis of a predetermined variable;
a null value detecting section that detects a first null value on the axis of the predetermined variable in the calculated spectrum;
a theoretical value calculating section that calculates theoretical values of a spectrum of the deterministic component based on the first null value detected by the null value detecting section, each of the theoretical values corresponding to one of a plurality of predetermined deterministic component types; and
a model determining section that determines the type of the deterministic component contained in the probability density function based on a plurality of logarithmic magnitude spectrum differences, each of the logarithmic magnitude spectrum differences being produced by subtracting one of the theoretical values calculated in association with the plurality of predetermined deterministic component types from the spectrum calculated by the spectrum calculating section, wherein
the model determining section includes:
a spectrum difference calculating section that calculates, in association with each of the plurality of predetermined deterministic component types, a logarithmic magnitude spectrum difference by subtracting the theoretical value of the spectrum of the deterministic component from the spectrum calculated by the spectrum calculating section;
an error calculating section that, in association with each of the plurality of predetermined deterministic component types, approximates the logarithmic magnitude spectrum difference by a quadratic curve and calculates a residual error by removing a component of the quadratic curve from the logarithmic magnitude spectrum difference; and
a selecting section that selects, as the type of the deterministic component contained in the probability density function, a deterministic component type associated with a smallest residual error from among the residual errors calculated by the error calculating section.

* * * * *